US009142708B2

(12) United States Patent
Naito et al.

(10) Patent No.: US 9,142,708 B2
(45) Date of Patent: Sep. 22, 2015

(54) GLASS COMPOSITION AND CONDUCTIVE PASTE FOR ALUMINUM ELECTRODE WIRING, ELECTRONIC COMPONENT PROVIDED WITH THAT ALUMINUM ELECTRODE WIRING AND METHOD FOR PRODUCING THIS ELECTRONIC COMPONENT

(75) Inventors: Takashi Naito, Funabashi (JP); Takuya Aoyagi, Tsuchiura (JP); Shinichi Tachizono, Narita (JP); Kei Yoshimura, Inzai (JP); Yuji Hashiba, Narita (JP)

(73) Assignees: HITACHI, LTD., Tokyo (JP); HITACHI CHEMICAL COMPANY, LTD., Tokyo (JP)

( * ) Notice: Subject to any disclaimer, the term of this patent is extended or adjusted under 35 U.S.C. 154(b) by 272 days.

(21) Appl. No.: 13/581,237

(22) PCT Filed: Feb. 17, 2011

(86) PCT No.: PCT/JP2011/053363
§ 371 (c)(1),
(2), (4) Date: Aug. 24, 2012

(87) PCT Pub. No.: WO2011/118297
PCT Pub. Date: Sep. 29, 2011

(65) Prior Publication Data
US 2012/0325297 A1 Dec. 27, 2012

(30) Foreign Application Priority Data
Mar. 25, 2010 (JP) .................. 2010-069090

(51) Int. Cl.
*H01B 1/02* (2006.01)
*H01L 31/18* (2006.01)
(Continued)

(52) U.S. Cl.
CPC .............. *H01L 31/1804* (2013.01); *C03C 8/00* (2013.01); *H01B 1/22* (2013.01); *H01L 31/022425* (2013.01); *Y02E 10/547* (2013.01)

(58) Field of Classification Search
CPC . H01L 31/022425; Y02E 10/50; C03C 3/021; C03C 3/122
USPC .................... 252/182.1, 512, 520.4; 136/252; 174/126.1; 313/582; 438/98; 501/15
See application file for complete search history.

(56) References Cited

U.S. PATENT DOCUMENTS

2003/0010644 A1   1/2003   Sonoda et al.
2006/0169971 A1   8/2006   Cho et al.
(Continued)

FOREIGN PATENT DOCUMENTS

CN    1877864 A    12/2006
CN    101425545 A   5/2009
(Continued)

*Primary Examiner* — Khanh Tuan Nguyen
(74) *Attorney, Agent, or Firm* — Volpe and Koenig, P.C.

(57) ABSTRACT

Disclosed is a constitution formed from an oxide of an element having a smaller work function than aluminum. This oxide is comprises an oxide of vanadium (V), an oxide of an alkaline earth metal and an oxide of an alkali metal. The elements for the alkaline earth metal are comprise one or more elements out of the elements calcium (Ca), strontium (Sr) and barium (Ba) and at least contain barium. The elements for the alkali metal include at least one or more of sodium (Na), potassium (K), rubidium (Rb) and cesium (Cs). When the element vanadium is included as vanadium pentoxide ($V_2O_5$), the vanadium pentoxide content is 40-70 wt %. Thus, a glass composition for aluminum electrode wiring with an apparent work function for electrode wiring that is smaller than the work function for aluminum (Al) can be provided without the inclusion of lead.

15 Claims, 4 Drawing Sheets

(51) Int. Cl.
  *C03C 8/00* (2006.01)
  *H01L 31/0224* (2006.01)
  *H01B 1/22* (2006.01)

(56) References Cited

U.S. PATENT DOCUMENTS

| | | | |
|---|---|---|---|
| 2007/0191203 A1* | 8/2007 | Yoshida et al. | 501/15 |
| 2008/0238315 A1* | 10/2008 | Hojo et al. | 313/582 |
| 2008/0238316 A1* | 10/2008 | Hayashibara et al. | 313/582 |
| 2009/0120483 A1 | 5/2009 | Carroll et al. | |

FOREIGN PATENT DOCUMENTS

| | | | | |
|---|---|---|---|---|
| EP | 0505061 | A2 | 9/1992 | |
| GB | 744947 | * | 2/1956 | |
| JP | 59-033869 | A | 2/1984 | |
| JP | 07-058369 | * | 3/1995 | H01L 41/04 |
| JP | 07-058369 | A | 3/1995 | |
| JP | 07-073731 | A | 3/1995 | |
| JP | 2006-332032 | A | 12/2006 | |
| JP | 2007-058369 | A2 | 3/2007 | |
| JP | 2007-073731 | A2 | 3/2007 | |
| JP | 2008-543080 | A | 11/2008 | |
| JP | 2009-016320 | * | 1/2009 | H01J 9/02 |
| JP | 2009-209032 | A2 | 9/2009 | |
| JP | 2010-161331 | A2 | 7/2010 | |
| JP | 2010-184852 | A2 | 8/2010 | |
| WO | 2006-132766 | A2 | 12/2006 | |
| WO | 2010-109903 | A1 | 9/2010 | |
| WO | 2010/109905 | A1 | 9/2010 | |

* cited by examiner

GLASS COMPOSITION AND CONDUCTIVE PASTE FOR ALUMINUM ELECTRODE WIRING, ELECTRONIC COMPONENT PROVIDED WITH THAT ALUMINUM ELECTRODE WIRING AND METHOD FOR PRODUCING THIS ELECTRONIC COMPONENT

TECHNICAL FIELD

The present invention relates to a glass composition and a conductive paste for an aluminum electrode wire, an electronic component provided with the aluminum electrode wire, and a method for manufacturing the electronic component.

BACKGROUND ART

An electrode wire is formed in a solar battery cell, or in an electronic component of a plasma display (PDP) or a liquid crystal display (LCD). Such an electrode wire is formed, using a conductive paste. Silver (Ag) or aluminum (Al) is used as metal particles for a conductive paste. An electrode wire is formed by firing a conductive paste in the atmosphere at a high temperature. Herein, in addition to metal particles, the conductive paste contains powder of a glass composition, and the glass composition becomes soft and flows when heated to a temperature higher than or equal to the softening point of the glass composition during firing of the conductive paste so that a silver electrode wire or an aluminum electrode wire becomes densified and firmly adhered to a substrate.

For this glass composition, used is a lead oxide (PbO) based glass composition that becomes soft and flows at a comparatively low temperature. However, as the lead oxide contained in the glass composition is a harmful material, in order to attain reduction in the environmental load, a lead free glass composition has come to be used for an electrode wire of a solar battery cell, an electronic component of a plasma display panel, or the like. For example, Patent Document 1 presents a lead free glass containing a bismuth oxide ($Bi_2O_3$) and a silicon oxide ($SiO_2$) to be used for a silver (Ag) electrode wire or an aluminum (Al) electrode wire formed in a solar battery cell. Further, Patent Document 2 presents a lead free glass containing a bismuth oxide and a boron oxide (B2O3) to be used for an aluminum electrode wire formed in a solar battery cell.

BACKGROUND ART DOCUMENTS

Patent Document

Patent Document 1: JP 2008-543080 A
Patent Document 2: JP 2006-332032 A

DISCLOSURE OF THE INVENTION

Problem to be Solved by the Invention

In case that a small (apparent) work function is necessary for an electronic component, an aluminum electrode wire is used. For example, a silver electrode wire is applied to the n-type semiconductor side of a solar battery cell with p-n junction, however, an aluminum electrode wire is applied to the p-type semiconductor side to improve the conversion efficiency.

Using a lead oxide based glass composition for an aluminum electrode wire enables making the apparent work function of the aluminum electrode wire small to the degree of the work function of aluminum because the work function of lead is smaller than the work function of aluminum. On the other hand, bismuth, silicon, and boron, which are the component elements of the lead free glasses presented by Patent Document 1 and Patent Document 2, have a work function larger than the work function of aluminum, and the apparent work function of an electrode wire is thought larger than the apparent work function of an electrode wire using lead.

In this situation, an object of the present invention is to provide a glass composition for an aluminum electrode wire, the glass composition having an apparent work function as an electrode wire smaller than the work function of aluminum, provide a conductive paste using this glass composition, provide an electronic component provided with this aluminum electrode wire, and further provide a method for manufacturing this electronic component.

Means for Solving the Problem

In order to attain the above object, according to the present invention, a glass composition for an aluminum electrode wire includes: an oxide/oxides of an element/elements with a work function smaller than a work function of aluminum.

Further, according to the invention, provided is a conductive paste for an aluminum electrode wire, a plurality of particles formed from aluminum and/or an alloy containing aluminum and powder formed from a glass composition being dispersed in a binder resin dissolved in a solvent, wherein the glass composition for an aluminum electrode wire according to the invention is used as the glass composition forming the powder.

Still further, according to the invention, provided is an electronic component that is provided with an aluminum electrode wire containing a plurality of particles formed from aluminum and/or an alloy containing aluminum and a glass composition for fixing the particles to a substrate, wherein the glass composition for an aluminum electrode wire according to claim 1 is used as the glass composition for fixing the particles to the substrate.

Yet, further, according to the invention, provided is a method for manufacturing an electronic component for which an aluminum electrode wire is formed by: coating, on a substrate, a conductive paste in which a plurality of particles formed from aluminum and/or an alloy containing aluminum and powder formed from a glass composition that is formed from an oxide/oxides of an element/elements with a work function smaller than a work function of aluminum are dispersed in a binder resin dissolved in a solvent; and firing the coated conductive paste.

Advantages of the Invention

According to the present invention, it is possible to provide a glass composition for an aluminum electrode wire, the glass composition having an apparent work function as an electrode wire smaller than the work function of aluminum, provide a conductive paste using this glass composition, provide an electronic component provided with this aluminum electrode wire, and further provide a method for manufacturing this electronic component.

EMBODIMENTS FOR CARRYING OUT THE INVENTION

Figure 1A:
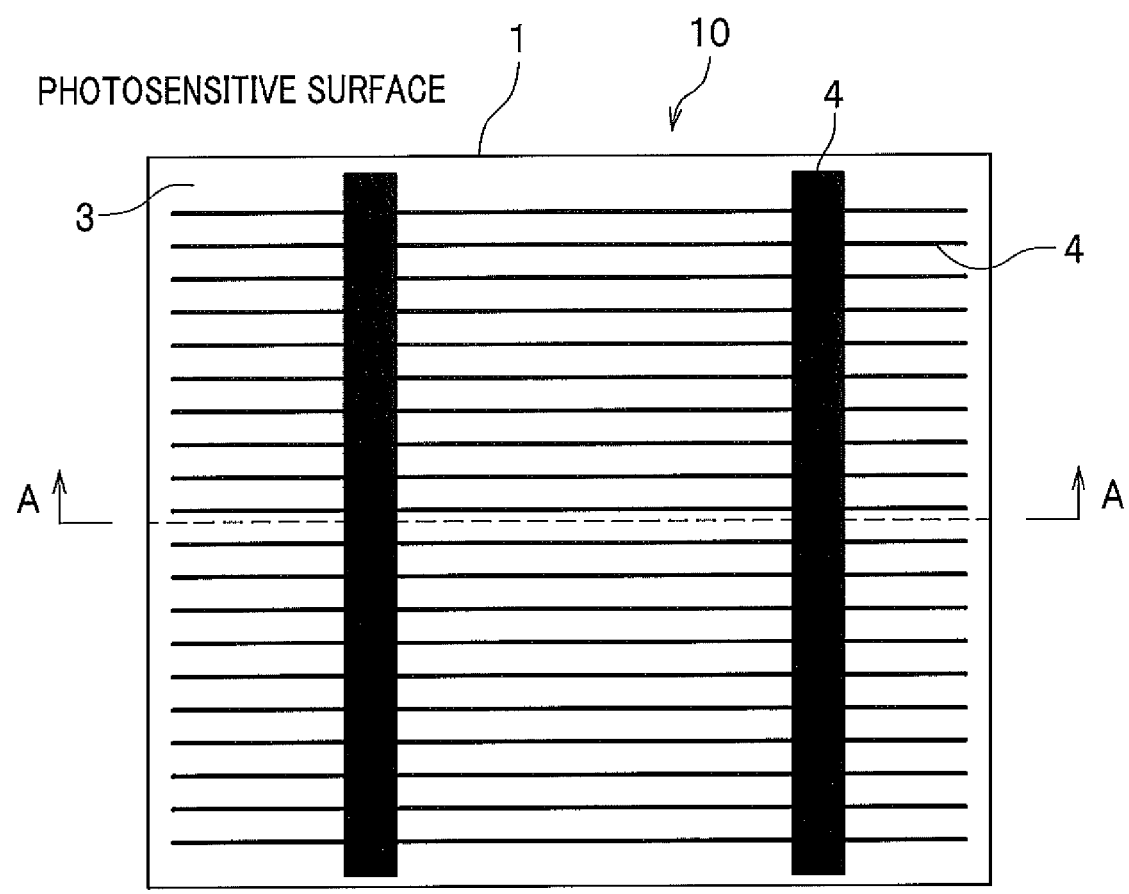
FIG. 1A is a plan view of a solar battery cell (electronic component) according to a first embodiment of the invention.

The inventors applied a glass composition formed from oxides of elements with a work function smaller than the work function of aluminum (Al) to an aluminum electrode wire so that the glass composition is free from oxides of elements with a work function larger than the work function of aluminum unless the elements are essential. The inventors found that it is thereby possible to improve the performance of an electronic component in which this aluminum electrode wire is formed. For example, regarding a solar battery cell, the conversion efficiency was improved as will be described later in detail. Also in the case of crystalline materials which are not a glass composition, there exist many oxides of elements with a work function smaller than the work function of aluminum, however, a crystalline material does not have a sufficient softening and flowing characteristics at an temperature lower than the electrode firing temperature, which causes a problem that it is difficult or impossible to form a satisfactory aluminum electrode wire for an electronic component. Accordingly, containing a glass composition is effective in forming an aluminum electrode wire. The inventors have found that this glass composition is preferably formed at least by an oxide of vanadium (V), an oxide of an alkaline-earth metal, and an oxide of an alkali metal.

TABLE 1

| Element | Work Function (eV) | Work Function Evaluation | Remarks |
| --- | --- | --- | --- |
| Al | 4.25 | — | Reference |
| V | 4.12 | A | Glass Main |
| Pb | 4.0 | A | Component |
| Bi | 4.4 | C | Element |
| Sn | 4.38 | C | |
| Si | 4.8 | C | Vitrifying |
| B | 4.5 | C | Element |
| P | 4.54 | C | |
| Te | 4.78 | C | |
| Ba | 2.49 | S | Alkaline-Earth |
| Sr | 2.35 | S | Metal Element |
| Ca | 2.8 | S | |
| Cs | 1.81 | S | Alkali Metal |
| Rb | 2.16 | S | Element |
| K | 2.22 | S | |
| Na | 2.35 | S | |
| Zn | 4.24 | B | Equivalent |
| Fe | 4.31 | C | to Al |
| W | 4.54 | C | |
| Sb | 4.08 | A | |

Table 1 shows the work functions of respective elements. Aluminum (Al) was taken up as an element, and vanadium (V), lead (Pb), bismuth (Bi), and tin (Sn) were taken up as the elements of the glass main components. Further, as vitrifying elements to be added for promoting vitrification of the glass composition, silicon (Si), boron (B), phosphorus (P), and tellurium (Te) were taken up. As elements belonging to alkaline-earth metals, barium (Ba), strontium (Sr), and calcium (Ca) were taken up. As elements belonging to alkali metals, cesium (Cs), rubidium (Rb), potassium (K), and Sodium (Na) were taken up. As other elements to be added to the glass composition, zinc (Zn), iron (Fe), tungsten (W), and antimony (Sb) were taken up.

In Table 1, the work functions of the respective elements were evaluated with reference to the work function 4.25 eV of aluminum. Elements with a work function that is lower than 4.00 eV, which is lower than the work function 4.25 eV of aluminum by 0.25 eV, was evaluated 'S' as an element with a work function significantly smaller than the work function of aluminum. Elements with a work function higher than or equal to 4.00 eV and lower than 4.24 eV were evaluated 'A' as elements with a work function a littler lower than the work function of aluminum. Elements with a work function higher than or equal to 4.24 eV and lower than or equal to 4.25 eV, which is the work function of aluminum, were evaluated 'B' as elements with a work function equivalent to the work function of aluminum. Elements with a work function exceeding 4.25 eV, which is the work function of aluminum, were evaluated 'C' as elements with a work function larger than the work function of aluminum. Herein, the work functions of the respective elements in Table1 were quoted from V. S. Fomenko, Handbook of Thermionic Properties, Plenum Press (1966). The work function of phosphorous (P) was not quoted as it was not described. Phosphorous (P) was coated on an electrode wire of tungsten (W). As the apparent work function of the electrode wire of tungsten thereby became larger than the work function of tungsten (W), the work function of phosphorous (P) was determined larger than the work function 4.54 eV of tungsten (W) (the work function of phosphorus (P)>4.54 eV).

According to the evaluation of work functions in Table 1, elements evaluated 'S' were barium (Ba), strontium (Sr), and calcium (Ca) which belong to alkaline-earth metals, and cesium (Cs), rubidium (Rb), potassium (K), and Sodium (Na) which belong to alkali metals. These elements belonging to alkaline-earth metals and elements belonging to alkali metals proved to have a work function smaller than the work function of aluminum.

Elements evaluated 'A' were vanadium (V), lead (Pb), and antimony (Sb). Vanadium (V), lead (Pb), and antimony (Sb) proved to have a work function smaller than the work function of aluminum. An element evaluated 'B' was zinc (Zn). Zinc (Zn) proved to have a work function substantially equivalent to the work function of aluminum. On the other hand, elements evaluated 'C' were bismuth (Bi) and tin (Sn) which are elements of the glass main components, silicon (Si), boron (Bi), phosphorus (P), and tellurium (Te) which are vitrifying elements, iron (Fe), and tungsten (W). Bismuth (Bi) and tin (Sn) which are elements of the glass main components, silicon (Si), boron (Bi), phosphorus (P), and tellurium (Te) which are vitrification elements, iron (Fe), and tungsten (W) proved to have a work function larger than the work function of aluminum.

From the above, it is thought that elements suitable to form a glass composition that is capable of obtaining a small apparent work function of an aluminum wire electrode are elements evaluated 'S', namely barium (Ba), strontium (Sr), and calcium (Ca) which belong to alkaline-earth metals, cesium (Cs), rubidium (Rb), potassium (K), and Sodium (Na) which belong to alkali metals, and elements evaluated 'A', namely vanadium (V), lead (Pb), and antimony (Sb).

On the other hand, it is thought that elements evaluated 'C', namely silicon (Si), boron (Bi), phosphorus (P), and tellurium (Te) which are vitrifying elements were thought to be elements unsuitable to form a glass composition that is capable of obtaining a small apparent work function of an aluminum wire electrode. It was also thought that elements evaluated 'C', namely Bismuth (Bi) and tin (Sn) to be used for lead free glass, taking the place of lead (Pb), are unsuitable as elements for forming a glass composition capable of obtaining a small apparent work function of an aluminum wire electrode. Compared with a case of applying an aluminum electrode wire having a glass composition forming a glass system of Pb.B.Si.O to a solar battery cell, a case of applying an aluminum electrode wire having a glass composition forming a glass system of Bi.B.Si.O to a solar battery cell tends to make the conversion efficiency low. It is thought that this tendency is caused by the difference in the work function between lead (Pb) and bismuth (Bi), which are elements forming a glass composition. It was also thought that other elements unsuitable to form a glass composition capable of obtaining a small apparent work function of an aluminum wire electrode are the element evaluated 'B', namely zinc (Zn), and element evaluated 'C', namely iron (Fe) and tungsten (W).

From the evaluation of work functions in Table 1, it is thought that, as elements of the glass main components of a glass composition for an aluminum electrode wire, A-evaluated vanadium (V) is desirably used instead of lead (Pb). In order that aluminum particles in an aluminum electrode wire are made adhere to a substrate, the glass composition needs to easily soften and flow when fired. In order to make the glass composition easily soften and flow when fired, the softening point is desired to be low as much as possible, and vitrification (forming a glass composition) capable of dropping the softening point is effective means.

In order to vitrify an oxide (glass composition) containing vanadium (V) as a main component (of glass), barium (Ba), strontium (Sr), and calcium (Ca) with a large ion radius are effective as alkaline-earth metals to be added to the glass composition, wherein barium (B) has a particularly large ion radius to be effective for vitrification. Incidentally, the smaller the ion radius of an alkaline-earth metal is, the harder the vitrification of the alkaline-earth metal is, and accordingly, magnesium (Mg) is excluded in advance from Table 1. That is, as alkaline-earth metals to be added to a glass composition, one or more elements including at least barium (Ba) are preferably selected from calcium (Ca), strontium (Sr), and barium (Ba).

Likewise, in order to vitrify an oxide (glass composition) containing vanadium (V) as a main component (of glass), cesium (Cs), rubidium (Rb), potassium (K), and sodium (Na) with a large ion radius are effective as alkali metals to be added to the glass composition. Incidentally, the smaller the ion radius of an alkali metal is, the harder the vitrification of the alkali metal is, and accordingly, lithium (L) is excluded in advance from Table 1. That is, as alkali metals to be added to a glass composition, one or more elements are preferably selected from cesium (Cs), rubidium (Rb), potassium (K), and Sodium (Na). Herein, considering vitrification and the work function, cesium (Cs) is effective as cesium (Cs) has a large ion radius and a small work function, however, cesium carbonate ($Cs_2CO_3$) as a raw material for glass is expensive. Considering not only vitrification and the work function but also the cost, it is thought that the most effective alkali metal is potassium (K).

As described above, by adding alkaline-earth metals with a large ion radius and alkali metals with a large ion radius to an oxide (glass composition) containing vanadium (V) as a main component (of glass), the oxide can be easily vitrified. Accordingly, a glass composition containing vanadium (V) as a main component of glass and added alkaline-earth metals and alkali metals can be vitrified even without containing a vitrifying element with a work function larger than the work function of ordinarily used aluminum (Al), and a glass composition can be formed only by elements with a work function smaller than the work function of aluminum (Al). Thus, it is possible to decrease the apparent work function of an aluminum electrode wire, and the performance of an electronic component, and particularly the conversion efficiency of a solar battery cell can be improved, as will be described later in detail.

The glass composition containing vanadium (V) as a main component of glass and added alkaline-earth metals and alkali metals preferably contains 40 to 70 weight % (as so-called oxide conversion) of vanadium pentoxide in case the element of vanadium (V) is contained as vanadium pentoxide ($V_2O_5$), preferably contains 20 to 40 weight % (as so-called oxide conversion) of the oxide represented by chemical expression Reno in case the alkaline-earth element Run is contained as the oxide represented by chemical expression Reno, and preferably contains 10 to 20 weight % (as so-called oxide conversion) of the oxide represented by chemical expression $R_2O$ in case the alkali metal element R is contained as the oxide represented by chemical expression $R_2O$.

If vanadium pent oxide ($V_2O_5$) is contained by a weight % smaller than 40 weight % (in oxide conversion), it is difficult to improve chemical stabilities as an aluminum electrode wire, such as water resistance, moisture resistance (of aluminum particles), and the like, and further the firing temperature of the aluminum electrode wire excessively rises. On the other hand, if the weight % (in oxide conversion) of vanadium pent oxide ($V_2O_5$) exceeds 70 weight %, the chemical stabilities of the glass composition itself, such as water resistance, moisture resistance, and the like drop, and the glass composition becomes hard to be handled. Further, the advantage of high performance of an electronic component, particularly improvement in the conversion efficiency of a solar battery cell cannot be obtained.

Further, if the weight % of the oxide represented by chemical expression Reno is smaller than 20 weight % in oxide conversion, the glass composition is hard to be vitrified, while the firing temperature of an aluminum electrode wire becomes excessively high if the weight % exceeds 40 weight %.

Further, if the weight % of the oxide represented by chemical expression $R_2O$ is smaller than 10 weight % in oxide conversion, the glass composition hardly obtains satisfactory softening and flowing characteristics, while the chemical stabilities of the glass composition itself, such as water resistance, moisture resistance, and the like drop if the weight % exceeds 20 weight %.

Inside a glass composition containing vanadium (V) as a glass main component and added alkaline-earth metals and alkali metals, fine crystals separate out when an aluminum electrode wire is fired. The glass composition is crystallized in the heating process during electrode firing, and shows satisfactory softening and flowing characteristics during electrode firing. In this crystallization, a crystal phase (fine crystal) is formed such as to disperse in the glass phase of the glass composition. As the particle diameter of the crystal phase (fine crystal) is approximately 10 to 60 nm, crystals are not noticeable. However, depending on the degree of crystallization, the softening and allowing characteristic of the glass composition can be affected in a low temperature region. Further, in a solar battery cell, it is possible to perform control of increasing and decreasing the Al diffusion amount from an aluminum electrode wire (aluminum particles) into a silicon (Si substrate), depending on the degree of the crystallization. The temperature of the crystallization is preferably lower than or equal to 500° C., and further preferably lower than or equal to 400° C. In case that crystallization occurs at a high temperature exceeding 500° C., as the temperature of softening and flowing also becomes high, dropping the temperature of firing the electrode is inhibited.

Further, the temperature at which the glass composition softens and flows is preferably lower than or equal to 700° C., and further preferably lower than or equal to 600° C. If the temperature at which the glass composition softens and flows is lower than or equal to 700° C., the glass composition can be applied not only to an aluminum electrode wire of a solar battery cell and the like, but also to an aluminum electrode wire for various electronic components, and thus wide and effective application can be extended. On the other hand, softening and flowing at a high temperature exceeding 700° C. limits electronic components for application. For example, in forming an aluminum electrode wire for a solar battery cell, softening and flowing at a high temperature exceeding 700° C. tends to cause insufficient firing and application is thus difficult. Ordinarily, an aluminum electrode wire for a solar battery cell is fired at approximately 800° C., and the firing time at the peak temperature of approximately 800° C. is short. Accordingly, a glass composition cannot be sufficiently fired, unless the glass composition is a glass composition with a satisfactory softening and flowing characteristics at highest 700° C. or lower in a temperature rising process.

Incidentally, according to the evaluation of work functions in Table 1, lead (Pb) and antimony (Sb) are evaluated 'A' and are elements that can be used for a glass composition, judging from this evaluation. Particularly, considering the effects on the environment load, lead (Pb) can be used not as a glass main component element but as an additive in a smaller amount. Of course, lead (Pb) may be not used for a glass composition.

A glass composition containing vanadium (V) as a glass main component and added alkaline-earth metals and alkali metals is made into powder. This powder and a plurality of aluminum particles formed from aluminum and/or an alloy containing aluminum disperse in a binder resin dissolved in a solvent and become a conductive paste for an aluminum electrode wire. This conductive paste is coated on a substrate by a screen printing method or the like, dried, and fired, and thus an aluminum electrode wire is formed. The fired aluminum electrode wire contains the plurality of fired aluminum particles and the glass composition that softens and flows in firing and fixes these aluminum particles to the substrate. The substrate with an aluminum electrode wire formed thereon is assembled to become an electronic component of a solar battery cell, a display panel, or the like. The substrate of the electronic component has a p-type semiconductor, and the aluminum electrode wire is formed on this p-type semiconductor. As the apparent work function of the aluminum electrode wire has become low, the aluminum electrode wire can form ohmic contact with the p-type semiconductor. For an electronic component of a solar battery cell or the like in which a substrate has p-n junction, an aluminum electrode wire is to be formed on the p-type semiconductor side of the p-n junction.

In the conductive paste, it is preferable that the powder of the glass composition is contained in a ratio of 0.2 to 20 weight parts to 100 weight parts of aluminum particles. It is further preferable that the powder of the glass composition is contained in a ratio of 0.2 to 2 weight parts to 100 weight parts of aluminum particles. If the powder of the glass composition is contained in a ratio smaller than 0.2 weight parts, the aluminum electrode wire cannot be adhered to the substrate tightly enough, and further, the electrical resistance of the aluminum electrode wire rises. On the other hand if the powder of the glass composition is contained in a ratio exceeding weight parts, the electrical resistance of the aluminum electrode wire becomes high. Further, if the powder of the glass composition is contained in a ratio exceeding 20 weight parts, the stress caused mutually in the aluminum electrode wire and the substrate tends to become strong, and the substrate may be broken in case that the strength of the substrate cannot be ensured duo to the small thinness of the substrate or the like.

Embodiments according to the present invention will be described in detail below, referring to the drawings, as appropriate. The same symbol will be assigned to each element that is common in respective figures, and overlapping description will be omitted. Further, the invention is not limited to the individuals of the plural embodiments taken up below, and combinations may be made, as appropriate.

First Embodiment

Discussion about Softening and Flowing of Glass Composition

In a first embodiment, discussion was made on softening and flowing of the glass system of a glass composition.

As shown in Table 2, in the first embodiment, 13 kinds of glass compositions were prepared, that are Inventive Examples 1 to 5 and Comparative Examples 1 to 8, softening and flowing tests were carried out using the respective glass compositions, and the softening and flowing characteristics were evaluated. Further, conductive pastes were prepared using the respective glass compositions, electrode wires were prepared using the respective conductive pastes, solar battery cells were completed, and the conversion efficiencies were measured and evaluated. In preparing the glass compositions, the glass compositions were produced changing the composition of the glass system for the respective Inventive Examples 1 to 5 and Comparative Examples 1 to 8.

TABLE 2

|  |  | Glass System | Glass Main Component Oxide | Pb Contained or Not | Softening and Flowing Test (Rapid Heating, Maintaining for 1 min) | | | |
|---|---|---|---|---|---|---|---|---|
|  |  |  |  |  | 500° C. | 600° C. | 700° C. | 800° C. |
| Inventive Example | 1 | V—Ba—Cs—O | $V_2O_5$ | No | B | A | A | A |
|  | 2 | V—Ba—Sr—Cs—K—O | $V_2O_5$ | No | B | A | A | A |
|  | 3 | V—Ba—Ca—Rb—K—O | $V_2O_5$ | No | B | A | A | A |
|  | 4 | V—Ba—Cs—Na—Sb—O | $V_2O_5$ | No | B | B | A | A |
|  | 5 | V—Ba—Cs—Pb—O | $V_2O_5$ | Yes | B | A | A | A |

TABLE 2-continued

|  |  | Glass System | Glass Main Component Oxide | Pb Contained or Not | Softening and Flowing Test (Rapid Heating, Maintaining for 1 min) | | | |
|---|---|---|---|---|---|---|---|---|
|  |  |  |  |  | 500° C. | 600° C. | 700° C. | 800° C. |
| Comparative Example | 1 | Pb—B—Si—Al—Zn—O | PbO | Yes | B | A | A | A |
|  | 2 | Bi—B—Si—Zn—Ba—K—O | $Bi_2O_3$ | No | B | A | A | A |
|  | 3 | Sn—P—Zn—O | SnO | No | B | A | A | A |
|  | 4 | V—P—Fe—K—O | $V_2O_5$ | No | C | B | A | A |
|  | 5 | V—P—W—Ba—O | $V_2O_5$ | No | B | A | A | A |
|  | 6 | V—Te—Ba—Zn—O | $TeO_2$ | No | A | A | A | A |
|  | 7 | V—P—Te—Ba—W—Fe—O | $V_2O_5$ | No | A | A | A | A |
|  | 8 | V—B—Zn—O | ZnO | No | C | A | A | A |

(1-1 Preparation of Glass Composition)

Glass compositions (oxides) having the compositions of glass systems shown in Inventive Examples 1 to 5 and Comparative Examples 1 to 8 in Table 2 were prepared. The compositions of glass systems shown in Inventive Examples 1 to 4 and Comparative Examples 2 to 8 in Table 2 were not made contain lead (Pb), which is a material prohibited by RoHS instruction. In Inventive Example 5, lead (Pb) is made contained not as a main component but as an additive. In Comparative Example 1, lead (Pb) was made contained as a main component.

Vanadium (V) was selected as the main component of the composition of the glass system in each of Inventive Examples 1 to 5, and vanadium pentoxide ($V_2O_5$) was selected as the oxide of the glass main component. Further, alkaline-earth metals and alkali metals were added.

In Inventive Example 1, barium (Ba), which is an alkaline-earth metal, and cesium (Cs), which is an alkali metal, were added as additives to the main component vanadium (V).

In Inventive Example 2, barium (Ba) and strontium (Sr), which are alkaline-earth metals, and cesium (Cs) and potassium (K), which are alkali metals, were added as additives to the main component vanadium (V).

In Inventive Example 3, barium (Ba) and calcium (Ca), which are alkaline-earth metals, and rubidium (Rb) and potassium (K), which are alkali metals, were added as additives to the main component vanadium (V).

In Inventive Example 4, barium (Ba), which is an alkaline-earth metal, further cesium (Cs) and sodium (Na), which are alkali metals, and still further antimony (Sb) were added as additives to the main component vanadium (V).

In Inventive Example 5, barium (Ba), which is an alkaline-earth metal, further cesium (Cs), which is an alkali metal, and still further lead (Pb) were added as additives to the main component vanadium (V).

In such a manner, the glass compositions in Inventive Examples 1 to were formed only from oxides of elements with a work function smaller than the work function of aluminum. The glass compositions in Inventive Examples 1 to 5 are different from ordinary glass, and do not contain oxides of silicon (Si), boron (B), phosphorus (P), and tellurium (Te), which are vitrifying elements. The work functions of the elements of silicon (Si), boron (B), phosphorus (P), and tellurium (Te) are significantly larger than the work function of aluminum (Al), as shown in Table 1.

In Comparative Example 1, lead oxide (PbO) was selected as the glass main component oxide, and boron (B) and silicon (Si), which are vitrifying elements, and further aluminum (Al) and zinc (Zn) were added as additives to the main component lead (Pb).

In Comparative Example 2, bismuth oxide ($Bi_2O_3$) was selected as the glass main component oxide, and boron (B) and silicon (Si), which are vitrification elements, further, zinc (Zn), and barium (Ba), which is an alkaline-earth metal, and potassium (K), which is an alkali metal, were added as additives to the main component bismuth (Bi).

In Comparative Example 3, tin oxide (SnO) was selected as the glass main component oxide, and phosphorus (P), which is a vitrification element, and further zinc (Zn) were added as additives to the main component tin (Sn).

In Comparative Example 4, vanadium pentoxide ($V_2O_5$) was selected as the glass main component oxide, and phosphorus (P), which is a vitrification element, further iron (Fe), and potassium (K), which is an alkali metal, were added as additives to the main component vanadium (V).

In Comparative Example 5, vanadium pentoxide ($V_2O_5$) was selected as the glass main component oxide, and phosphorus (P), which is a vitrification element, further tungsten (W), and barium (Ba), which is an alkaline-earth metal, were added as additives to the main component vanadium (V).

In Comparative Example 6, tellurium oxide ($TeO_2$) was selected as the glass main component oxide, and barium (Ba), which is an alkaline-earth metal, and zinc (Zn) were added as additives to the tellurium (Te), which is a main component and a vitrification element, and vanadium (V), which is a main component.

In Comparative Example 7, vanadium pentoxide ($V_2O_5$) was selected as the glass main component oxide, and phosphorus (P) and tellurium (Te), which are vitrification elements, further barium (Ba), which is an alkaline-earth metal, tungsten (W) and iron (Fe) were added as additives to the main component vanadium (V).

In Comparative Example 8, zinc oxide (ZnO) was selected as the glass main component oxide, and boron (B), which is a vitrification element, was added as an additive to zinc (Zn), which is a main component, and vanadium (V), which is a main component.

In such a manner, the glass compositions in Comparative Examples 1 to 8, oxides of elements with a work function larger than the work function of aluminum were contained. Further, oxides of silicon (Si), boron (B), phosphorus (P), and tellurium (Te), which are vitrifying elements with a work function extremely larger than the work function of aluminum (Al) were contained.

The glass compositions were concretely prepared in the following procedure.

First, raw material compounds in a powder form were mixed so that the compositions of the glass systems become predetermined compositions in the respective Inventive Examples 1 to 5 and Comparative Examples 1 to 8.

Vanadium pentoxide ($V_2O_5$) was used as the raw material compound of vanadium (V). Lead oxide (PbO) was used as the raw material compound of lead (Pb). Bismuth trioxide ($Bi_2O_3$) was used as the raw material compound of Bismuth (Bi). Tin oxide (SnO) was used as the raw material compound of tin (Sn). Silicon oxide ($SiO_2$) was used as the raw material compound of silicon (Si). Boron oxide ($B_2O_3$) was used as the raw material compound of boron (B). Phosphorus pentoxide ($P_2O_5$) was used as the raw material compound of phosphorus (P). Tellurium (Te) dioxide ($TeO_2$) was used as the raw material compound of tellurium (Te). Barium carbonate ($BaCO_3$) was used as the raw material compound of barium (Ba). Strontium carbonate ($SrCO_3$) was used as the raw material compound of strontium (Sr). Calcium carbonate ($CaCO_3$) was used as the raw material compound of calcium (Ca). Cesium carbonate ($Cs_2CO_3$) was used as the raw material compound of cesium (Cs). Rubidium carbonate ($Rb_2CO_3$) was used as the raw material compound of rubidium (Rb). Potassium carbonate ($K_2CO_3$) was used as the raw material compound of potassium (K). Sodium carbonate ($Na_2CO_3$) was used as the raw material compound of sodium (Na). Zinc oxide (ZnO) was used as the raw material compound of zinc (Zn). Diiron trioxide ($Fe_2O_3$) was used as the raw material compound of iron (Fe), however, iron oxide (FeO), triiron tetraoxide ($Fe_3O_4$), or the like may be used. Tungsten trioxide ($WO_3$) was used as the raw material compound of tungsten (W). Antimony trioxide ($Sb_2O_3$) was used as the raw material compound of antimony (Sb), however, antimony tetraoxide ($Sb_2O_4$) may be used.

Then, each mixed powder was put in a platinum crucible, and was heated and melt, using an electric furnace. As heating conditions, the mixed powder was heated at a temperature rise rate of 5 to 10° C./min up to 1000 to 1100° C., and this state with the heating temperature 1000 to 1100° C. was maintained for two hours. During this maintenance, the fused material was agitated such as to become uniform so that a uniform glass composition can be obtained.

Then, the platinum crucible was taken, with the high temperature thereof left as it is, out from the electric furnace, and the fused material was flowed onto a stainless steel plate which had been heated in advance to 200-300° C. The fused material was rapidly cooled to be vitrified, and was solidified to be a glass composition in a bulk form. The bulk formed glass composition was crushed using a stamp mill, and thus powder (powder of oxide) of a glass composition with a particle diameter smaller than 5 μm was prepared. This powder (powder of oxide) of this glass composition was pressed and hardened, and a compact of the glass composition was thus prepared in a cylindrical shape with a diameter of 10 mm and a thickness of mm.

(1-2 Softening and Flowing Test of Glass Composition)

Softening and flowing test of the compacts of the glass compositions were performed, wherein the glass compositions had been respectively prepared in Inventive Examples 1 to 5 and Comparative Examples 1 to 8. In the softening and flowing test, a compact was heated on an alumina ($Al_2O_3$) substrate to soften and flow, and the softening and flowing characteristics were evaluated according to the degree of the softening characteristic and the flowing characteristic. As a heating condition, the heating temperature was changed from 500° C., 600° C., 700° C., and 800° C. in the test. For heating, the compacts of the glass compositions were put in electric furnaces maintained at the respective heating temperatures for one minute and were taken out. The taken out compacts of the glass compositions were visually observed, and the softening and flowing characteristics were thus evaluated. As evaluation criteria, 'A' was assigned to a case that satisfactory softening and flowing characteristics were obtained, 'B' was assigned to a case that although satisfactory flowing characteristic was not obtained, softening occurred (satisfactory softening characteristic and unsatisfactory flowing characteristic), and 'C' was assigned to a case that softening did not occur (Both the softening characteristic and the flowing characteristic were unsatisfactory.)

As shown in Table 2, as a result of the softening and flowing test, for all the glass compositions in Inventive Examples 1 to 5 and Comparative Examples 1 to 8, the softening characteristic and the flowing characteristic were satisfactory at 700° C. and 800° C., and the glass compositions were evaluated 'A'.

At the temperature of 600° C., the softening characteristic and the flowing characteristic of the glass compositions were satisfactory in Inventive Examples 1 to 3, Inventive Examples 5, Comparative Examples 1 to 3, and Comparative Examples 5 to 8, and evaluation was 'A'. At the temperature of 600° C., in Inventive Example 4 and Comparative Example 4, although satisfactory softening characteristic of the glass compositions was observed, however, satisfactory flowing characteristic was not observed, and the evaluation was 'B'.

At the temperature of 500° C., the softening characteristic and the flowing characteristic of the glass compositions were satisfactory in Comparative Example 6 and Comparative Example 7, and the evaluation was 'A'. At the temperature of 500° C., in Inventive Examples 1 to 5, Comparative Examples 1 to 3, and Comparative Example 5, satisfactory softening characteristic was observed with the glass compositions, however, satisfactory flowing characteristic was not observed, and the evaluation was 'B'. At the temperature of 500° C., in Comparative Example 4 and Comparative Example 8, satisfactory characteristic was observed in neither softening or flowing with the glass compositions, and the evaluation was 'C'.

As described above, although the glass compositions in Inventive Examples 1 to 5 shown in Table 2 do not contain vitrifying elements shown in Table 1, namely silicon (Si), boron (B), phosphorus (P), tellurium (Te), or vanadium (V), these glass compositions ensured softening and flowing characteristics to the same degree as those of the glass compositions containing vitrification elements in Comparative Examples 1 to 8. It is thought that this was caused by adding alkaline-earth metals and alkali metals to the glass compositions in Inventive Examples 1 to 5 so that vitrification was promoted and the softening point dropped. As the softening point dropped, satisfactory softening and flowing characteristics were obtained at 700° C. or higher in Inventive Examples 1 to 5, and satisfactory softening and flowing characteristics were obtained at 600° C. or higher in Inventive Examples 1 to 3 and Inventive Example 5.

(1-3 Preparation of Conductive Paste)

Conductive pastes were prepared with the respective glass compositions prepared in Inventive Examples 1 to 5 and Comparative Examples 1 to 8. Glass compositions in a bulk form were crushed using a stamp mill, and powder (powder of oxide) of the glass compositions was prepared with a particle diameter smaller than or equal to 5 μm. The average particle diameter (D50) of the powder of the glass compositions was approximately 2 μm.

As metallic particles to be contained in the conductive pastes, aluminum particles with an average particle diameter (D50) of approximately 4 μm were prepared. First, aluminum was melt, and aluminum particles in a spherical shape were prepared by a water atomizing method. Particles with a diameter smaller than 0.5 μm were removed from these aluminum particles by a filter, and particles with a diameter larger than or equal to 8 μm were removed by a filter, and the remaining aluminum particles were used for the conductive pastes. The aluminum particles used for the conductive pastes had an average particle diameter (D50) of approximately 4 μm, and had a volume ratio larger than or equal to approximately 95% in a range of particle diameter larger than or equal to 0.5 μm and smaller than 8 μm.

The aluminum particles and the powder of the glass compositions (oxide) were mixed respectively in Inventive Examples 1 to 5 and Comparative Examples 1 to 8, and further to these mixtures, a binder resin and a solvent were added and mixed for kneading. The binder resin dissolved in the solvent, the aluminum particles and the powder of the glass compositions (oxide) dispersed in the binder resin having dissolved in the solvent, and the conductive pastes were thereby completed. Ethyl cellulose was used as the binder resin, and butyl carbitol acetate was used as the solvent.

In Inventive Examples 1 to 5 and Comparative Examples 3 to 8, the powder of the glass compositions (oxide) was mixed by 2 weight parts to the 100 weight parts of aluminum particles. In Comparative Example 1 and Comparative Example 2, the powder of the glass compositions (oxide) was mixed by 4 weight parts to the 100 weight parts of aluminum particles. The reason for performing such mixing is that the specific gravity of the glass compositions (oxide) in Comparative Example 1 and Comparative Example 2 were approximately double as the specific gravity of the other glass compositions (oxide) in other examples, and the volume ratios of the glass compositions (oxide) in the conductive pastes were aimed at approximately the same among Inventive Examples 1 to 5 and Comparative Examples 1 to 8. The weight ratios of the solid portion of the conductive pastes formed from the aluminum particles and the powder of the glass compositions (oxide) to the weight of the conductive pastes were made 70 to 75 weight %.

(1-4 Production of Solar Battery Cell)

Solar battery cells were produced with the respective glass compositions prepared in Inventive Examples 1 to 5 and Comparative Examples 1 to 8, that are the respective conductive pastes.

Figure 1B:
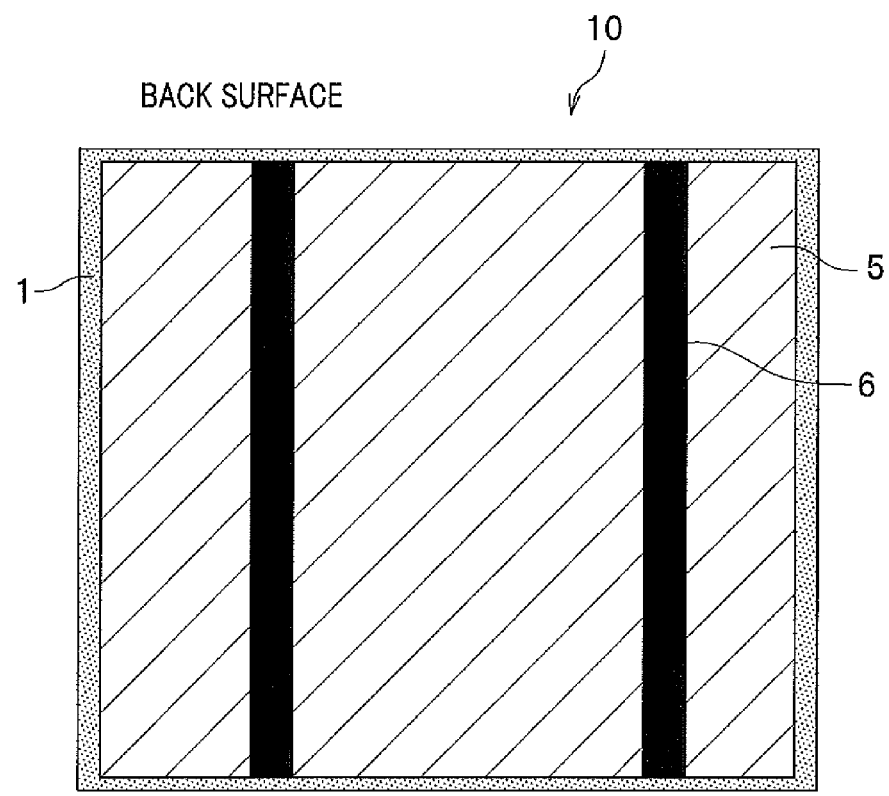
FIG. 1B is a bottom view of the solar battery cell (electronic component) according to the first embodiment of the invention.
Figure 1C:
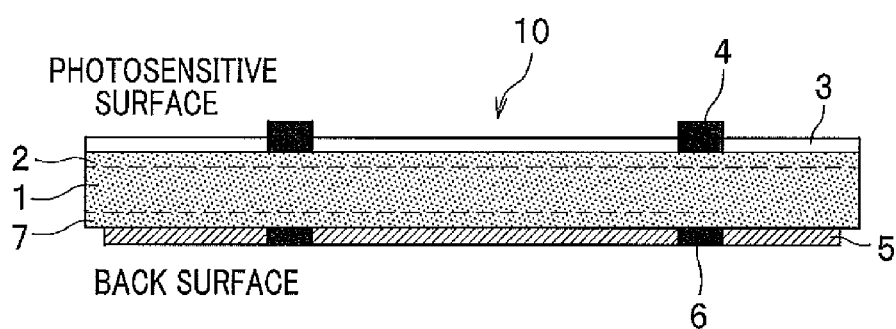
FIG. 1C is a cross sectional view taken along arrowed direction A-A' in FIG. 1A.

FIG. 1A is a plan view of a solar battery cell (electronic component) produced in the first embodiment of the invention; FIG. 1B is a bottom view of the solar battery cell 10; and FIG. 1C is a cross sectional view taken along arrowed direction A-A' in FIG. 1A. In the first embodiment, the solar battery cell 10 will be taken as an example of an electronic component to which the present invention can be applied.

An aluminum electrode wire, for en electronic component, according to the present invention is applied to the back surface electrode (aluminum electrode wire) 5 of the solar battery cell (electronic component) 10 shown in FIG. 1B and FIG. 1C. The back surface electrode (aluminum electrode wire) 5 is formed on the back surface of a semiconductor substrate (substrate) 1 formed by a p-type silicon substrate.

As the semiconductor substrate 1, a single-crystal silicon substrate, a polycrystalline silicon substrate, or the like is used. This semiconductor substrate 1 contains boron (B) and the like and is a p-type semiconductor. The photosensitive surface side, shown in FIG. 1A, of the semiconductor substrate 1 is provided with concavities and convexities (not shown) by etching or the like to reduce reflection of solar light. Further, as shown in FIG. 1C, on the photosensitive surface side of the semiconductor substrate 1, phosphorus (P) and the like are doped to form a diffusion layer 2 of a n-type semiconductor with a thickness in submicrons. The n-type semiconductor of the diffusion layer 2 and the p-type semiconductor of the semiconductor substrate 1 form a p-n junction section. In the p-n junction section, a pair of electron and hole generated by absorption of a solar light is separated into an electron and a hole to generate a voltage. Aluminum is doped at high concentrations on the back surface side of the photosensitive surface of the semiconductor substrate 1, and an alloy layer (Back Surface Field: BSF layer) 7 of a p+ type semiconductor is formed with a thickness in submicrons. Formation of the alloy layer 7 prevents carriers, which are generated inside the semiconductor substrate 1, from recombining on the back surface, and enables improvement in the performance of the solar battery cell.

As shown in FIG. 1A, photosensitive surface electrode wires 4 are provided on the photosensitive surface of the semiconductor substrate 1. The photosensitive surface electrode wires 4 include thick wires disposed such as to be vertically across the photosensitive surface of the semiconductor substrate 1, and thin wires disposed in a grid form (a pectinate shape or a ladder shape) with respect to these thick wires so that the photosensitive surface electrode wires 4 can collect electricity from the whole photosensitive surface. On the photosensitive surface of the semiconductor substrate 1, a reflection preventing layer 3 of a silicon nitride ($Si_3N_4$) or the like is formed with a thickness of approximately 100 nm. The photosensitive surface electrode wires 4 are formed by firing a conductive paste containing glass powder and silver particle.

As shown in FIG. 1B and FIG. 1C, on the back surface of the photosensitive surface of the semiconductor substrate 1, a back surface electrode 5 and an output electrodes 6 are provided. The back surface electrode 5 is arranged such as to cover almost the whole surface of the back surface of the photosensitive surface of the semiconductor substrate 1, and electricity can be collected from almost the whole back surface of the photosensitive surface of the semiconductor substrate 1. The output electrodes 6 are disposed in parallel such as to be vertically across the back surface of the photosensitive surface of the semiconductor substrate 1, and electricity can be collected from the back surface electrode 5. The output electrodes 6 are formed by firing a conductive paste containing powder of an oxide and silver particles. Back surface electrodes 5 are respectively formed by firing a conductive paste containing powder of the glass composition (oxide) prepared in corresponding one of Inventive Examples 1 to 5 and Comparative Examples 1 to 8 and aluminum particles.

A method for manufacturing the solar battery cell 10 will be described below.

A p-type silicon substrate was prepared as the semiconductor substrate 1. The size of the semiconductor substrate 1 was set to be 125 mm square and 200 μm thick. Then, though not shown, for improvement in the light incidence efficiency, the photosensitive surface side of the semiconductor substrate 1 was etched to form concavities and convexities, using a strong aqueous solution of 1% sodium hydroxide (NaOH) and 10% isopropyl alcohol ($CH_3CH(OH)CH_3$).

A liquid containing phosphorus pentoxide ($P_2O_5$) was coated on the photosensitive surface side of the semiconductor substrate 1 and treated for minutes at 900° C., to thereby diffuse phosphorus (P) from phosphorus pentoxide ($P_2O_5$) to the semiconductor substrate 1 and thus form the diffusion layer 2 of a n-type semiconductor on the photosensitive surface side. After removing phosphorus pentoxide ($P_2O_5$), the reflection preventing layer 3 of silicon nitride film was formed uniformly thick on the diffusion layer 3. This silicon nitride film can be formed by a plasma CVD method or the like with a mixed gas of silane ($SiH_4$) and ammonia ($NH_3$) as a raw material.

Then, in order to form the photosensitive surface electrode wires 4, a commercially available conductive paste (silver paste) containing powder of an oxide and silver particles was coated by a screen print method on the reflection preventing layer 3 in a grid form in which the photosensitive surface electrode wires 4 are disposed, and was dried by heating at 150° C. for minutes. As the powder of the oxide of the silver paste, powder of a glass composition of a glass system of Pb—B—Si—Al—Zn—O was used.

On the back surface side of the photosensitive surface of each semiconductor substrate 1, the same silver paste as described above was coated for the output electrodes 6 by the screen print method such as to form the pattern shown in FIG. 1B. For the back surface electrodes 5, a conductive paste (aluminum paste) containing powder of the respective glass composition (oxide) prepared in corresponding one of Inventive Examples 1 to 5 and Comparative Examples 1 to 8 and aluminum particles was coated by the screen print method such as to form the pattern shown in FIG. 1B. Then, the output electrodes 6 and the back surface electrode 5 were dried by heating at 150° C. for 30 minutes. For coating the silver paste and the aluminum paste, whichever of the photosensitive surface side and the back surface side may be coated and dried first.

Then, using an infrared rapid heating furnace, each conductive paste (silver paste or aluminum paste) was rapidly heated in the atmosphere up to 800° C., the corresponding whole semiconductor substrate 1 with the conductive paste being heated, and was subjected to firing, with this heated state maintained for 20 seconds. Thus, the photosensitive surface electrode wires 4, the output electrodes 6, and the back surface electrode 5 were simultaneously formed, thereby completing a solar battery cell 10. Through this firing, the binder resin and the solvent in the back surface electrode 5 (aluminum paste) volatilized and burned, and were removed from the back surface electrode (aluminum paste) 5. Further, through this firing, plural aluminum particles in the back surface electrode 5 (aluminum paste) were sintered into one body, and the powder of the glass composition in the back surface electrode 5 (aluminum paste) softened and flowed to tightly adhere to the aluminum particles and the semiconductor substrate 1, and thereby the aluminum particles and the semiconductor substrate 1 were bonded with each other.

Further, through this firing, the powder of the glass composition in the back surface electrode 5 (aluminum paste) crystallizes, and crystal phases of fine crystals are generated and dispersed in the glass phase of the glass composition. The generation state of the fine crystals affects the concentration of impurities in the p+ type semiconductor of a later described alloy layer. If the generation frequency of fine crystals is excessively high, the concentration of impurities in the p+ type semiconductor of the alloy layer 7 becomes excessively low to drop the conversion efficiency of the solar battery cell 10. If the generation frequency of fine crystals is excessively low or no fine crystals are generated, the concentration of impurities in the p+ type semiconductor of the alloy layer 7 becomes excessively high to drop the conversion efficiency of the solar battery cell 10. If the generation frequency of fine crystals is adequate, the concentration of impurities in the p+ type semiconductor of the alloy layer 7 becomes adequate, and the conversion efficiency of the solar battery cell 10 can be increased.

Further, through this firing, on the back surface side of the semiconductor substrate 1, aluminum diffuses with a high concentration from the aluminum particles of the back surface electrode 5, which is based on an aluminum paste, into the semiconductor substrate 1 under the back surface electrode 5, and an alloy layer 7 of the p+ type semiconductor is thereby formed. This formation of the alloy layer 7 can not only increase the conversion efficiency of the solar battery cell 10 but also ohmic-connect the back surface electrode 5 with the semiconductor substrate 1.

Still further, through this firing, on the photosensitive surface side of the semiconductor substrate 1, the oxide (glass composition) contained in the photosensitive surface electrode wires 4 and the reflection preventing layer 3 react with each other, and as shown in FIG. 1C, the photosensitive surface electrode wires 4 penetrate through the reflection preventing layer 3 to reach the diffusion layer 2 so that the photosensitive surface electrode wires 4 and the diffusion layer 2 are ohmic-connected.

(1-5 Evaluation of Solar Battery Cell)

The conversion efficiencies of solar battery cells 10 prepared respectively in Inventive Examples 1 to 5 and Comparative Examples 1 to 8 were measured. A solar simulator was used for measuring. The conversion efficiencies as a result of measuring are shown in Table 3.

The conversion efficiency of the solar battery cell using the glass composition in Inventive Example 1 was 17.6%.
The conversion efficiency of the solar battery cell using the glass composition in Inventive Example 2 was 17.8%.
The conversion efficiency of the solar battery cell using the glass composition in Inventive Example 3 was 17.7%.
The conversion efficiency of the solar battery cell using the glass composition in Inventive Example 4 was 17.2%.
The conversion efficiency of the solar battery cell using the glass composition in Inventive Example 5 was 17.4%.
The conversion efficiency of the solar battery cell using the glass composition in Comparative Example 1 was 16.9%.
The conversion efficiency of the solar battery cell using the glass composition in Comparative Example 2 was 16.3%.
The conversion efficiency of the solar battery cell using the glass composition in Comparative Example 3 was 15.6%.
The conversion efficiency of the solar battery cell using the glass composition in Comparative Example 4 was 15.9%.
The conversion efficiency of the solar battery cell using the glass composition in Comparative Example 5 was 15.8%.
The conversion efficiency of the solar battery cell using the glass composition in Comparative Example 6 was 15.4%.
The conversion efficiency of the solar battery cell using the glass composition in Comparative Example 7 was 15.6%.
The conversion efficiency of the solar battery cell using the glass composition in Comparative Example 8 was 15.3%.

TABLE 3

|  |  | Gass Contained in Al Electrode | | Solar Battery Cell Evaluation |
|---|---|---|---|---|
|  |  | Glass System | Oxide | Pb Contained or Not | Conversion Efficiency (%) |
| Inventive Example | 1 | V—Ba—Cs—O | $V_2O_5$ | No | 17.6 |
|  | 2 | V—Ba—Sr—Cs—K—O | $V_2O_5$ | No | 17.8 |
|  | 3 | V—Ba—Ca—Rb—K—O | $V_2O_5$ | No | 17.7 |
|  | 4 | V—Ba—Cs—Na—Sb—O | $V_2O_5$ | No | 17.2 |
|  | 5 | V—Ba—Cs—Pb—O | $V_2O_5$ | Yes | 17.4 |

TABLE 3-continued

| | | Gass Contained in Al Electrode | | | Solar Battery Cell Evaluation |
|---|---|---|---|---|---|
| | | Glass System | Oxide | Pb Contained or Not | Conversion Efficiency (%) |
| Comparative Example | 1 | Pb—B—Si—Al—Zn—O | PbO | Yes | 16.9 |
| | 2 | Bi—B—Si—Zn—Ba—K—O | $Bi_2O_3$ | No | 16.3 |
| | 3 | Sn—P—Zn—O | SnO | No | 15.6 |
| | 4 | V—P—Fe—K—O | $V_2O_5$ | No | 15.9 |
| | 5 | V—P—W—Ba—O | $V_2O_5$ | No | 15.8 |
| | 6 | V—Te—Ba—Zn—O | $TeO_2$ | No | 15.4 |
| | 7 | V—P—Te—Ba—W—Fe—O | $V_2O_5$ | No | 15.6 |
| | 8 | V—B—Zn—O | ZnO | No | 15.3 |

At first glance, while the conversion efficiency of the solar battery cell 10 is higher than 17% in Inventive Examples 1 to 5, the conversion efficiency was lower than 17% in Comparative Examples 1 to 8, and an obvious tendency was recognized that the conversion efficiency is higher in Inventive Examples 1 to 5 than in Comparative Examples 1 to 8. This is because the glass composition of the back surface electrode (aluminum electrode wire) 5 is formed from oxides of elements with a work function smaller than the work function of aluminum (Al), and does not contain oxides of elements, other than essential elements, with a work function larger than the work function of aluminum. Accordingly, it is thought that the apparent work function of the back surface electrode (aluminum electrode wire) 5 could be decreased, the back surface electrode 5 could be ohmic-connected with a low resistance to the semiconductor substrate 1, and a high conversion efficiency could be thus obtained.

The powder of the glass composition in the back surface electrode (aluminum paste) 5 crystallizes in firing, and the crystal phases of fine crystals are generated and dispersed in the glass phase of the glass composition. It is thought that this generation state of fine crystals caused the diffusion amount of aluminum from aluminum particles into the semiconductor substrate 1 to be adequate, the concentration of impurities in the p+ type semiconductor of the alloy layer 7 was thereby set adequate, and the conversion efficiency of the solar battery cell 10 was accordingly increased.

In Inventive Examples 1 to 5, the glass composition of the back surface electrode (aluminum electrode wire) 5 could be formed from oxides of elements with a work function smaller than the work function of aluminum (Al) because alkaline-earth metals and alkali metals were used instead of using silicon (Si), boron (B), phosphorus (P), and tellurium (Te), as shown in Table 1, which were conventionally used as vitrifying elements. Particularly, in Inventive Examples 1 to 3, oxides of only alkaline-earth metals and alkali metals were used with an exception of the main component element of vanadium (V), and high conversion efficiencies higher than or equal to 17.6% were obtained in Inventive Examples 1 to 3. Incidentally, as shown in Inventive Example 4 and Inventive Example 5, it was recognized that a high conversion efficiency can also be obtained in case of containing not only elements of alkaline-earth metals and alkali metals, but also, in addition, antimony (Sb), which is an element with a work function smaller than the work function of aluminum (Al), and lead (Pb).

From the above, it was confirmed that an aluminum electrode wire, for an electronic component, according to the present invention can be applied as the back surface electrode 5 (the electrode (the p-type electrode) of a p-type semiconductor) of a solar battery cell 10. A back surface electrode 5 is an aluminum electrode wire that is ohmic-connected to a p-type semiconductor, and a back surface electrode 5 is thought to be also applicable to electrode wires to be ohmic-connected to the p-type semiconductor of an electronic component other than a solar battery cell 10. Of course, it is thought that, for an aluminum electrode wire (a back surface electrode 5) by the present invention for an electronic component, not only the contact resistance with respect to a p-type semiconductor is low, but also the specific electrical resistance is low. Accordingly, an aluminum electrode wire (a back surface electrode 5) by the present invention for an electronic component can also be used as an electrode wire for connecting electrodes.

As Comparative Example 9, using powder of crystals of vanadium pentoxide ($V_2O_5$) instead of powder of a glass composition and setting the other conditions to be the same as the conditions in Inventive Example 1 and the like, a conductive paste for an aluminum electrode wire was prepared. Using this conductive paste and setting the other conditions to be the same as the conditions in Inventive Example 1 and the like, a solar battery cell was prepared, and the conversion efficiency was measured. The conversion efficiency of a solar battery cell 10 using the crystal powder of vanadium pentoxide ($V_2O_5$) in Comparative Example 9 was 15.1%. The conversion efficiency of 15.1% in Comparative Example 9 was lower than any one of the conversion efficiencies in Inventive Examples 1 to 5 and Comparative Example 1 to 8 shown in Table 3. From this, it is thought that glass is more effective than crystals as the oxides (glass composition) of a conductive paste. Differently from the case in Inventive Examples 1 to 5 where crystal phases of fine crystals are generated and dispersed in the glass phase of oxides (glass composition), the oxides (glass composition) are crystals in all in this case. Accordingly, it is thought that diffusion of aluminum from aluminum particles into the semiconductor substrate 1 was restricted, the concentration of impurities in the p+ type semiconductor of the alloy layer 7 became low, and the conversion efficiency of the solar battery cell 10 thereby dropped. From this, the effectiveness of vitrification of the oxides (glass composition) of a conductive paste (aluminum electrode wire) became obvious. Further, from comparison between Inventive Examples 1 to 5 and Comparative Examples 1 to 8, it was recognized that the oxides (glass composition) in Inventive Example 1 to 5 are significantly effective. It is thought that this is because the oxides (glass composition) are oxides (glass composition) of elements with a work function smaller than the work function of aluminum, and concretely, oxides (glass composition) of vanadium (V), alkaline-earth metals and alkali metals.

Second Embodiment

Discussion on Composition Ratios of Oxides Composing Glass Composition

In a second embodiment, discussion was made on the composition ratios of oxides composing a glass composition.

As shown in Table 4, in the second embodiment, glass compositions in Inventive Examples G-01 to G-16, totally 16 kinds of glass compositions, were prepared. Using the respective glass compositions, measurement of the starting temperature of crystallization (differential thermal analysis (DTA)), a softening and flowing test, and a water resistance test of glass alone, were performed. Further, conductive pastes were prepared using the respective glass compositions, aluminum electrode wires were prepared using these respective conductive pastes, and solar battery cells were thus completed. Then, using these solar battery cells, measurement of conversion efficiencies, a tight adhesiveness test, and a water resistance test of electrode wires, were performed. In preparing the glass compositions, the composition ratios of the oxides composing the glass compositions were changed, respectively in Inventive Examples G-01 to G-16.

TABLE 4

| Inventive Example | Main Component | Alkaline-Earth Oxide | | | Akali Metal Oxide | | | |
|---|---|---|---|---|---|---|---|---|
| | $V_2O_5$ | CaO | SrO | BaO | $Na_2O$ | $K_2O$ | $Rb_2O$ | $Cs_2O$ |
| G-01 | 80 | | | 15 | | 5 | | |
| G-02 | 75 | | | 20 | | | | 5 |
| G-03 | 75 | | | 15 | | 5 | | 5 |
| G-04 | 70 | | | 20 | | 5 | | 5 |
| G-05 | 65 | | | 25 | | 10 | | |
| G-06 | 60 | | | 40 | | | | |
| G-07 | 60 | | | 30 | 1 | 7 | | 2 |
| G-08 | 55 | | | 45 | | | | |
| G-09 | 55 | | | 35 | | 10 | | |
| G-10 | 55 | 5 | 5 | 20 | 2 | 5 | 3 | 5 |
| G-11 | 50 | | | 35 | | 10 | | 5 |
| G-12 | 50 | | | 25 | | 10 | 5 | 5 |
| G-13 | 45 | | 10 | 25 | 3 | 10 | | 7 |
| G-14 | 40 | | 5 | 35 | 2 | 8 | 5 | 5 |
| G-15 | 35 | 5 | 10 | 30 | 4 | 10 | | 6 |
| G-16 | 30 | 10 | 10 | 25 | 5 | 10 | 5 | 5 |

(2-1 Preparation of Glass Compositions)

The glass compositions (oxides) with the respective compositions shown in Inventive Examples G-01 to G-16 in Table 4 were prepared. As the oxide of the main component containing vanadium (V), vanadium pentoxide ($V_2O_5$) was adopted. Further, arrangement was made such that the glass composition (oxide) contains alkaline-earth oxides and alkali metal oxides. As alkaline-earth oxides to be contained, calcium oxide (CaO) containing calcium (Ca), strontium oxide (SrO) containing strontium (Sr), and barium oxide (BaO) containing barium (Ba) were adopted. As alkali metal oxides to be contained, sodium oxide ($Na_2O$) containing sodium (Na), potassium oxide ($K_2O$) containing potassium (K), rubidium oxide ($Rb_2O$) containing rubidium (Rb), and cesium oxide ($Cs_2O$) containing cesium (Cs) were adopted. The values of weight % were computed such that the weights of three kinds of oxides were computed by so-called oxide conversion from the net weights of three kinds of elements that are vanadium (V), an alkaline-earth metal, and an alkali metal contained in a raw material compound and the weight % were computed from the ratios of the converted values (the weights of the tree kinds of oxides) of the three kinds.

In Inventive Example G-01, the composition ratios of the glass composition (oxide) were set to 80 weight % for vanadium pentoxide ($V_2O_5$), weight % for barium oxide (BaO), which is an alkaline-earth oxide, and 5 weight % for potassium oxide ($K_2O$), which is an alkali metal oxide.

In Inventive Example G-02, the composition ratios of the glass composition (oxide) were set to 75 weight % for vanadium pentoxide ($V_2O_5$), weight % for barium oxide (BaO), which is an alkaline-earth oxide, and 5 weight % for cesium oxide ($Cs_2O$), which is an alkali metal oxide.

In Inventive Example G-03, the composition ratios of the glass composition (oxide) were set to 75 weight % for vanadium pentoxide ($V_2O_5$), weight % for barium oxide (BaO), which is an alkaline-earth oxide, 5 weight % for potassium oxide ($K_2O$) and 5 weight % for cesium oxide ($Cs_2O$), which are alkali metal oxides.

In Inventive Example G-04, the composition ratios of the glass composition (oxide) were set to 70 weight % for vanadium pentoxide ($V_2O_5$), weight % for barium oxide (BaO), which is an alkaline-earth oxide, 5 weight % for potassium oxide ($K_2O$) and 5 weight % for cesium oxide ($Cs_2O$), which are alkali metal oxides.

In Inventive Example G-05, the composition ratios of the glass composition (oxide) were set to 65 weight % for vanadium pentoxide ($V_2O_5$), weight % for barium oxide (BaO), which is an alkaline-earth oxide, and 10 weight % for potassium oxide ($K_2O$), which is an alkali metal oxide.

In Inventive Example G-06, the composition ratios of the glass composition (oxide) were set to 60 weight % for vanadium pentoxide ($V_2O_5$), and 40 weight % for barium oxide (BaO), which is an alkaline-earth oxide.

In Inventive Example G-07, the composition ratios of the glass composition (oxide) were set to 60 weight % for vanadium pentoxide ($V_2O_5$), weight % for barium oxide (BaO), which is an alkaline-earth oxide, 1 weight % for sodium oxide ($Na_2O$), 7 weight % for potassium oxide ($K_2O$) and 2 weight % for cesium oxide ($Cs_2O$), which are alkali metal oxides.

In Inventive Example G-08, the composition ratios of the glass composition (oxide) were set to 55 weight % for vanadium pentoxide ($V_2O_5$), and 45 weight % for barium oxide (BaO), which is an alkaline-earth oxide.

In Inventive Example G-09, the composition ratios of the glass composition (oxide) were set to 55 weight % for vanadium pentoxide ($V_2O_5$), weight % for barium oxide (BaO), which is an alkaline-earth oxide, and 10 weight % for potassium oxide ($K_2O$), which is an alkali metal oxide.

In Inventive Example G-10, the composition ratios of the glass composition (oxide) were set to 55 weight % for vanadium pentoxide ($V_2O_5$), 5 weight % for calcium oxide (CaO), 5 weight % for strontium oxide (SrO), 20 weight % for barium oxide (BaO), which are alkaline-earth oxides, 2 weight % for sodium oxide ($Na_2O$), 5 weight % for potassium oxide ($K_2O$), 3 weight % for rubidium oxide ($Rb_2O$) and 5 weight % for cesium oxide ($Cs_2O$), which are alkali metal oxides.

In Inventive Example G-11, the composition ratios of the glass composition (oxide) were set to 50 weight % for vanadium pentoxide ($V_2O_5$), weight % for barium oxide (BaO), which is an alkaline-earth oxide, 10 weight % for potassium oxide ($K_2O$) and 5 weight % for cesium oxide ($Cs_2O$), which are alkali metal oxides.

In Inventive Example G-12, the composition ratios of the glass composition (oxide) were set to 50 weight % for vanadium pentoxide ($V_2O_5$), weight % for barium oxide (BaO), which is an alkaline-earth oxide, 10 weight % for potassium oxide ($K_2O$), 5 weight % for rubidium oxide ($Rb_2O$) and weight % for cesium oxide ($Cs_2O$), which are alkali metal oxides.

In Inventive Example G-13, the composition ratios of the glass composition (oxide) were set to 45 weight % for vanadium pentoxide ($V_2O_5$), weight % for strontium oxide (SrO), 25 weight % for barium oxide (BaO), which are alkaline-earth oxides, 3 weight % for sodium oxide ($Na_2O$), 10 weight % for potassium oxide ($K_2O$) and 7 weight % for cesium oxide ($Cs_2O$), which are alkali metal oxides.

In Inventive Example G-14, the composition ratios of the glass composition (oxide) were set to 40 weight % for vanadium pentoxide ($V_2O_5$), 5 weight % for strontium oxide (SrO), 35 weight % for barium oxide (BaO), which are alkaline-earth oxides, 2 weight % for sodium oxide ($Na_2O$), 8 weight % for potassium oxide ($K_2O$), 5 weight % for rubidium oxide ($Rb_2O$) and weight % for cesium oxide ($Cs_2O$), which are alkali metal oxides.

In Inventive Example G-15, the composition ratios of the glass composition (oxide) were set to 35 weight % for vanadium pentoxide ($V_2O_5$), 5 weight % for calcium oxide (CaO), 10 weight % for strontium oxide (SrO), 30 weight % for barium oxide (BaO), which are alkaline-earth oxides, 4 weight % for sodium oxide ($Na_2O$), 10 weight % for potassium oxide ($K_2O$) and 6 weight % for cesium oxide ($Cs_2O$), which are alkali metal oxides.

In Inventive Example G-16, the composition ratios of the glass composition (oxide) were set to 30 weight % for vanadium pentoxide ($V_2O_5$), weight % for calcium oxide (CaO), 10 weight % for strontium oxide (SrO), weight % for barium oxide (BaO), which are alkaline-earth oxides, 5 weight % for sodium oxide ($Na_2O$), 10 weight % for potassium oxide ($K_2O$), 5 weight % for rubidium oxide ($Rb_2O$) and 5 weight % for cesium oxide ($Cs_2O$), which are alkali metal oxides.

Preparation of the glass compositions was concretely carried out in the following procedure.

First, raw material compounds in a powder form were and mixed so that the compositions of the glass systems become predetermined compositions in the respective Inventive Examples G-01 to G-16. As the raw material compounds, the same raw material compounds were used for elements corresponding to those in the first embodiment.

Then, each mixed powder 300 g was put in a platinum crucible, and was heated and fused, using an electric furnace. As heating conditions, the mixed powder was heated up to 1100-1200° C. at a temperature rise rate of 5 to 10° C./min, and was maintained at the heating temperature 1100-1200° C. such as to become uniform so that a uniform glass composition can be obtained.

Then, the platinum crucible was taken, with the high temperature thereof left as it is, out from the electric furnace, and the fused material was flowed onto a stainless steel plate which had been heated in advance to 150-200° C. The fused material was rapidly cooled to be vitrified, and was solidified to be a glass composition in a bulk form. The bulk formed glass composition was crushed using a stamp mill, classified, and thus powder of a glass composition with an average particle diameter (D50) of 1 to 2 μm was prepared.

(2-2 Measurement of Starting Temperature of Crystallization of Glass Composition)

The characteristic temperatures of the glass compositions respectively prepared in Inventive Examples G-01 to G-16 were measured, and the starting temperatures of crystallization were thus obtained. For the measurement of the characteristic temperatures, a differential thermal analysis (DTA) device (produced by SHINKU RIKO KK, model No. DT-1500) was used. As a reference sample, α-alumina ($Al_2O_3$) was used, and both the mass of the reference sample and the mass of each of the prepared materials (powder of respective glass compositions in Inventive Example G-01 to G-16) were set to 1 g. In the measurement, the temperatures of the reference sample and each prepared sample were increased in the atmospheric environment at a temperature-increase rate of 5° C./min. A DTA curve was obtained from measurement of characteristic temperatures (DTA measurement), and a heat generation peak was measured from the DTA curve. The starting temperature of the heat generation peak (the temperature at a point where the tangent line of the DTA curve, which is before the start of increasing by the heat generation peak, and the tangent line of the DTA curve, which is during increasing in the first half of the heat generation peak, intersect with each other, wherein tangent lines is obtained by a tangent method) was defined and obtained as the starting temperature of crystallization of glass composition.

Table 5 shows the temperature ranges to which the starting temperatures of crystallization of the obtained glass compositions respectively belong. When the temperature becomes higher than or equal to the starting temperature of crystallization, crystal phases (fine crystals) are generated in the glass composition. These crystal phases are essential in order to adjust the concentration of impurities in the p+ type semiconductor of the alloy layer 7 (see FIG. 1C), and it is thought that the starting temperature of crystallization should be as low as possible in order to surely generate the crystal phases before diffusion of these impurities occurs. On the other hand, if crystallization is promoted and the volume of the crystal phases becomes excessively large at a temperature higher than the starting temperature of crystallization, the softening and flowing characteristics, later described, are restricted. Accordingly, evaluation should also be made on the softening and flowing characteristics as well.

TABLE 5

| | crystallization start temperature range | | | | softening and flowing test | | | | water resistance test result |
|---|---|---|---|---|---|---|---|---|---|
| Inventive | 300° C.- | 400° C.- | 500° C.- | | (rapid heating, maintaining for 1 min) | | | | 500° C.- |
| Example | 400° C. | 500° C. | 600° C. | 600° C.- | 500° C. | 600° C. | 700° C. | 800 ° C. | 8 Hours |
| G-01 | A | | | | C | C | A | A | C |
| G-02 | A | | | | C | C | A | A | C |
| G-03 | A | | | | C | C | A | A | C |
| G-04 | A | | | | B | A | A | A | A |
| G-05 | A | | | | A | A | A | A | A |
| G-06 | | | A | | C | C | B | A | A |
| G-07 | A | | | | A | A | A | A | A |

TABLE 5-continued

| Inventive Example | crystallization start temperature range 300° C.-400° C. | 400° C.-500° C. | 500° C.-600° C. | 600° C.- | softening and flowing test (rapid heating, maintaining for 1 min) 500° C. | 600° C. | 700° C. | 800° C. | water resistance test result 500° C.- 8 Hours |
|---|---|---|---|---|---|---|---|---|---|
| G-08 | | | | A | C | C | B | A | A |
| G-09 | A | | | | B | A | A | A | A |
| G-10 | A | | | | B | A | A | A | A |
| G-11 | | A | | | B | A | A | A | A |
| G-12 | A | | | | A | A | A | A | A |
| G-13 | | A | | | B | A | A | A | A |
| G-14 | | A | | | C | A | A | A | A |
| G-15 | | | | A | C | C | B | A | A |
| G-16 | | | A | | C | C | B | A | C |

Inventive examples in which the starting temperature of crystallization belongs to a low temperature range from 300° C. to 400° C. were Inventive Examples G-01 to G-05, Inventive Example G-07, Inventive Example G-09, Inventive Example G-10, and Inventive Example G-12. It can be said that these Inventive Examples tend to generate crystal phases.

Inventive examples in which the starting temperature of crystallization belongs to a medium low temperature range from 400° C. to 500° C. were Inventive Example G-11, Inventive Example G-13, and Inventive Example G-14. It can be said that these inventive examples tend to generate crystal phases.

Inventive examples in which the starting temperature of crystallization belongs to a medium high temperature range from 500° C. to 600° C. were Inventive Examples G-06 and Inventive Example G-16. It can be said that these Inventive Examples tend to restrict generation of crystal phases.

Inventive examples in which the starting temperature of crystallization belongs to a high temperature range from 600° C. and higher were Inventive Examples G-08 and Inventive Example G-15. It can be said that these Inventive Examples tend to restrict generation of crystal phases.

(2-3 Softening and Flowing Test of Glass Composition)

A softening and flowing test of the glass compositions respectively prepared in Inventive Examples G-01 to G-16 was performed. Powder (powder of oxides) of each glass composition was pressed and hardened, and a compact of the glass composition was thus prepared in a cylindrical shape with a diameter of 10 mm and a thickness of 5 mm. Then, the softening and flowing characteristics of the glass composition were evaluated by a test that is similar to the test in the first embodiment. Softening and flowing characteristics are essential in adhering aluminum particles in an aluminum electrode wire (conductive paste) to a substrate by a glass composition. In order to make the glass composition sufficiently soften and flow, it is desirable that the softening characteristic and the flowing characteristic occur at a temperature as low as possible.

As shown in Table 5, the result of the softening and flowing test is as follows.

In Inventive Example G-05, Inventive Example G-07, and Inventive Example G-12, the softening characteristic and the flowing characteristic were satisfactory at all of heating temperatures of 500° C., 600° C., 700° C., and 800° C., and evaluation 'A' was obtained. It can be said that these inventive examples tend to make softening and flowing characteristics occur.

In Inventive Example G-04, Inventive Examples G-09 to G-11, and Inventive Example G-13, at a heating temperature of 500° C., satisfactory softening characteristic was recognized while satisfactory flowing characteristic was not recognized wherein evaluation was 'B', and at heating temperatures of 600° C., 700° C., and 800° C., the softening characteristic and the flowing characteristic were satisfactory wherein evaluation 'A' was obtained. It can be said that these inventive examples tend to make softening and flowing characteristics occur.

In Inventive Example G-14, at a heating temperature of 500° C., neither the softening characteristic or the flowing characteristic was satisfactory wherein the evaluation was 'C', however, at heating temperatures of 600° C., 700° C., and 800° C., the softening characteristic and the flowing characteristic were satisfactory wherein evaluation 'A' was obtained. It can be said that this inventive example tends to make softening and flowing characteristics occur.

In Inventive Example G-01, Inventive Example G-02, and Inventive Example G-03, at heating temperatures of 500° C. and 600° C., neither the softening characteristic or the flowing characteristic was satisfactory wherein the evaluation was 'C', however, at heating temperatures 700° C. and 800° C., the softening characteristic and the flowing characteristic were satisfactory wherein the evaluation was 'A'. In these inventive examples, satisfactory softening and flowing characteristics were not recognized at a temperature of 600° C., and it can be said that these inventive examples tend to make softening and flowing characteristics restricted from occurring.

In Inventive Example G-06, Inventive Example G-08, Inventive Example G-15, and Inventive Example G-16, at heating temperatures of 500° C. and 600° C., neither the softening characteristic or the flowing characteristic was satisfactory wherein the evaluation was 'C', however, at a heating temperature of 700° C., satisfactory softening characteristic was recognized while satisfactory flowing characteristic was not recognized wherein the evaluation was 'B', and at a heating temperature of 800° C., the softening characteristic and the flowing characteristic were satisfactory wherein evaluation 'A' was obtained. In these inventive examples, at a temperature of 600° C., satisfactory softening and flowing characteristics were not recognized, and it can be said that these inventive examples tend to make softening and flowing characteristics restricted from occurring.

(2-4 Water Resistance Test of Glass Composition)

A water resistance test of the glass compositions was performed by dipping the respective glass compositions in Inventive Example G-01 to G-16 in pure water at 50° C. for 8 hours after the softening and flowing test at a heating temperature of 800° C. Thereafter, the glass compositions were visually observed to determine the water resistance from the corrosion state. As determination criteria, a case that almost no change is recognized in appearance was evaluated 'A', and a case that an obvious change is recognized was evaluated 'C'. As a glass composition to be used for an aluminum electrode wire, a high water resistance is desired.

As Table 5 shows, as a result of the water resistance test of the glass compositions, evaluation 'A' was obtained for Inventive Examples G-04 to G15, and evaluation 'C' was made on Inventive Examples G-01 to G-03 and Inventive Example G-16.

In the below, a comprehensive assessment was made on the results of the measurement of the starting temperatures of crystallization of the glass compositions in 2-2, the softening and flowing test of the glass compositions in 2-3, and the water resistance test of the glass compositions in 2-4.

While, as shown in Table 5, it proved that crystallization of the glass compositions starts in a low temperature range from 300° C. to 400° C. in Inventive Examples G-01 to G-03, it further proved that crystallization is significantly promoted and the volume of crystal phases are significantly large at a temperature lower than or equal to 400° C. This represents a nature of these glass compositions that these glass compositions do not tend to vitrify and tend to crystallize. From this, it is thought that the glass phase in the each glass composition relatively decreases and the softening and flowing characteristics dropped. Satisfactory softening and flowing characteristics were not obtained at a temperature of 600° C. or lower, and it is thought that this is caused by the effects of an increase in the crystal phases. Further, it is also thought that the drop in the water resistance of the glass compositions in Inventive Examples G-01 to G-03 was caused by crystallization. It is thought that metal deposited at a crystal grain boundary accompanying crystallization, and the metal corroded and oxidized. It is thought that the nature of tendency these glass compositions, in Inventive Examples G-01 to G-03, to crystallize is caused, as shown in Table 4, by that the composition ratio of the vanadium pentoxide ($V_2O_5$) was large and the weight % was higher than or equal to 75 weight %. It is also thought that, in reverse, another cause is that the composition ratio of the alkaline-earth oxides and the composition ratio of alkali metal oxides, which promote vitrification, to the composition ratio of vanadium pentoxide ($V_2O_5$) were low, and particularly that the composition ratio of barium oxide (BaO) was low. From the above, it proved that the composition ratio of vanadium pentoxide ($V_2O_5$) is desirably smaller than 75 weight %. In reverse, it proved that the total of the composition ratio of the alkaline-earth oxides and the composition ratio of alkali metal oxides, which promote vitrification, is desirably higher than or equal to 25 weight %.

The glass compositions in Inventive Example G-06 and Inventive Example G-08 started crystallization at a high temperature exceeding 500° C., as shown in Table 5. At a temperature of 700° C. or lower, satisfactory flowing characteristic was not obtained. On the other hand, the water resistance was satisfactory. It is thought that these are because alkali metal oxides were not contained in the glass compositions. Further, the temperature of starting crystallization is higher in Inventive Example G-08 than in Inventive Example G-06 because the composition ratio of barium oxide (BaO) is large. From the above, it proved that not only alkaline-earth oxide but also alkali metal oxide are essential for glass composition. Further, it proved that the starting temperature of crystallization can be dropped by decreasing the composition ratio of the alkaline-earth oxide, namely barium oxide (BaO), for example, to be 40 weight % or lower.

The glass compositions in Inventive Example G-15 and Inventive Example G-16 started crystallization at a high temperature exceeding 500° C., as shown in Table 5. Further, satisfactory flowing characteristic was not obtained at a temperature of 700° C. or lower. It is thought that these are because the composition ratio of the total of the alkaline-earth oxides was 45 weight % and exceedingly high. Regarding water resistance, water resistance was satisfactory in Inventive Example G-15, while water resistance was unsatisfactory in Inventive Example G-16. It is thought that this is because the composition ratio of the total of the alkali metal oxides was 20 weight % in Inventive Example G-15, while the total of the alkali metal oxides was 25 weight % in Inventive Example G-16 to be exceedingly high. From the above, it proved that the composition ratio of the total of alkaline-earth oxides should be lower than 45 weight %. Further, it proved that the composition ratio of the total of alkali metal oxides should be lower than 25 weight %.

The glass compositions in Inventive Example G-04, Inventive Example G-05, Inventive Example G-07, and Inventive Examples G-09 to G-14 started crystallization at a low temperature of 500° C. or lower, as shown in Table 5, and the crystallization was not significant in terms of the total volume. Accordingly these glass compositions had satisfactory softening and flowing characteristics even at a temperature 600° C. or lower. Particularly, the glass compositions in Inventive Example G-05, Inventive Example G-07, and Inventive Example G-12, the glass compositions having a starting temperature of crystallization 400° C. or lower, tended to show satisfactory softening and flowing characteristics, and show satisfactory softening and flowing characteristics even at 500° C. Further, the water resistance of these glass compositions was satisfactory. From the above, as shown by Inventive Example G-04, Inventive Example G-05, Inventive Example G-07, and Inventive Examples G-09 to G-14 in Table 4, it proved that the composition ratio of vanadium pentoxide ($V_2O_5$) should be 40 weight % to 70 weight %. Further, it proved that the composition ratio of the total of alkaline-earth oxides should be 20 weight % to 40 weight %. Still further, it proved that the composition ratio of the total of alkali metal oxides should be 10 weight % to 20 weight %.

(2-5 Preparation of Conductive Paste)

Conductive pastes were prepared with the glass compositions respectively prepared in Inventive Examples G-01 to G-16. Glass compositions in a bulk form were crushed using a stamp mill, and powder (powder of oxides) of the glass compositions was prepared. The average particle diameter (D50) of the powder of the glass compositions was approximately 1 μm to 2 μm. As metal particles to be contained in the conductive pastes, aluminum (alloy) particles having an average particle diameter (D50) of approximately 3 μm and containing a small amount of calcium (Ca) were used. For each conductive paste, 1 weight part of powder of glass compositions (oxides) was mixed to 100 weight parts of aluminum (alloy) particles. In the second embodiment, accompanying that the average particle diameter (D50) of the powder of glass compositions were made 1 μm to 2 μm to be smaller than that in the first embodiment, the mixing amount of the powder of glass compositions (oxide) with respect to aluminum (alloy) particles was decreased to 1 weight part. Other preparation conditions in preparing the conductive pastes were made the same as those in the first embodiment.

(2-6 Preparation of Solar Battery Cell)

Solar battery cells were prepared with the glass compositions respectively prepared in Inventive Examples G-01 to G-16, in other words, with the respective conductive pastes. In the second embodiment, polycrystalline silicon substrates (p-type semiconductor substrate) having boron (B) contained in a semiconductor substrate 1 were used. The size of the polycrystalline silicon substrates was set to 150 mm square and 200 μm thick. Then, solar battery cells were prepared by a method for manufacturing that is similar to the method for manufacturing a solar battery cell 10 in the first embodiment.

(2-7 Evaluation of Solar Battery Cell)

As shown in Table 6, for evaluation of solar battery cells, measurement of conversion efficiencies, a tight adhesiveness test, and a water resistance test of the solar battery cells, were performed. First, the respective conversion efficiencies of the solar battery cells prepared with the respective glass compositions in Inventive Examples G-01 to G-16 were measured. In the measurement, a solar simulator was used. The conversion efficiencies of a measurement result are shown in Table 6.

TABLE 6

| Inventive Example | Conversion Efficiency (%) | Tight Adhesiveness Test Result | Water Resistance Test Result 50° C.- 8 hours |
|---|---|---|---|
| G-01 | 15.6 | A | A |
| G-02 | 14.9 | A | A |
| G-03 | 15.5 | A | A |
| G-04 | 16.1 | A | A |
| G-05 | 16.3 | A | A |
| G-06 | 15.4 | C | C |
| G-07 | 16.5 | A | A |
| G-08 | 15.2 | C | C |
| G-09 | 16.5 | A | A |
| G-10 | 16.2 | A | A |
| G-11 | 16.6 | A | A |
| G-12 | 16.4 | A | A |
| G-13 | 16.5 | A | A |
| G-14 | 16.1 | A | A |
| G-15 | 15.8 | C | C |
| G-16 | 15.5 | C | C |

The conversion efficiency of the solar battery cell using the glass composition in Inventive Example G-01 was 15.6%.
The conversion efficiency of the solar battery cell using the glass composition in Inventive Example G-02 was 14.9%.
The conversion efficiency of the solar battery cell using the glass composition in Inventive Example G-03 was 15.5%.
The conversion efficiency of the solar battery cell using the glass composition in Inventive Example G-04 was 16.1%.
The conversion efficiency of the solar battery cell using the glass composition in Inventive Example G-05 was 16.3%.
The conversion efficiency of the solar battery cell using the glass composition in Inventive Example G-06 was 15.4%.
The conversion efficiency of the solar battery cell using the glass composition in Inventive Example G-07 was 16.5%.
The conversion efficiency of the solar battery cell using the glass composition in Inventive Example G-08 was 15.2%.
The conversion efficiency of the solar battery cell using the glass composition in Inventive Example G-09 was 16.5%.
The conversion efficiency of the solar battery cell using the glass composition in Inventive Example G-10 was 16.2%.
The conversion efficiency of the solar battery cell using the glass composition in Inventive Example G-11 was 16.6%.
The conversion efficiency of the solar battery cell using the glass composition in Inventive Example G-12 was 16.4%.
The conversion efficiency of the solar battery cell using the glass composition in Inventive Example G-13 was 16.5%.
The conversion efficiency of the solar battery cell using the glass composition in Inventive Example G-14 was 16.1%.
The conversion efficiency of the solar battery cell using the glass composition in Inventive Example G-15 was 15.8%.
The conversion efficiency of the solar battery cell using the glass composition in Inventive Example G-16 was 15.5%.

Then, for the respective solar battery cells in Inventive Examples G-01 to G-16, the strength of adhesion (tight adhesiveness) to a semiconductor substrate 1 (see FIG. 1C) was evaluated by a peel test. In the peel test, a commercially available adhesive cellophane tape was stuck to the back electrode (aluminum electrode wire) 5 and was thereafter peeled off. Then, after the peeling off, the back electrode (aluminum electrode wire) 5 was observed and evaluated. As evaluation criterion, Inventive Examples in which the back electrode (aluminum electrode wire) 5 did not peel off were evaluated 'A', and Inventive Examples in which the back electrode (aluminum electrode wire) 5 peeled off were evaluated 'C'. As shown in Table 6, as a result of the peel test, Inventive Examples G-01 to G-05, Inventive Example G-07, and Inventive Examples G-09 to G-14 were evaluated 'A', and Inventive Example G-06, Inventive Example G-08, Inventive Example G-15, and Inventive Example G-16 were evaluated 'C'.

Then, as a water resistance test similar to the water resistance test of the glass components in 2-4, the back electrodes (aluminum electrode wire) 5 (see FIG. 1C) of the respective solar battery cells in Inventive Examples G-01 to G-16 were dipped in pure water at a temperature of 50° C. for 8 hours. Thereafter, the each back electrode (aluminum electrode wire) was visually observed and the water resistance was determined from a change in the color. As determination criterion, Inventive Examples in which almost no change in the color was recognized in appearance were evaluated 'A', and Inventive Examples in which a change in the color was recognized were evaluated 'C'. Incidentally, it is known that, when a conventional aluminum electrode wire is dipped in pure water at a temperature of 50° C. for 8 hours, the color of the aluminum electrode wire is changed into black color by generation of hydroxide of aluminum (the electrode wire). As shown in Table 6, as a result of the water resistance test of the each back electrode (aluminum electrode wire) 5, Inventive Examples G-01 to G-05, Inventive Example G-07, and Inventive Examples G-09 to G-14 were evaluated 'A' and Inventive Example G-06, Inventive Example G-08, Inventive Example G-15, and Inventive Example G-16 were evaluated 'C'.

From the measurement of the conversion efficiencies performed as evaluation of the solar battery cells, it proved that the conversion efficiency was higher than 16% in Inventive Example G-04, Inventive Example G-05, Inventive Example G-07, and Inventive Examples G-09 to G-14 and thus high conversion efficiencies were obtained, compared with conversion efficiencies lower than 16% in other Inventive Examples, namely, Inventive Examples G-01 to G-03, Inventive Example G-06, Inventive Example G-08, Inventive Example G-15, and Inventive Example G-16. Further, in Inventive Example G-04, Inventive Example G-05, Inventive Example G-07, Inventive Examples G-09 to G-14, satisfactory results were obtained in both the tight adhesiveness test and the water resistance test.

In Inventive Examples G-01 to G-03, although a high conversion efficiency was not obtained, a satisfactory result was obtained by the tight adhesiveness test and the water resistance test of the back surface electrode (aluminum electrode wire) 5. As shown in the result of the water resistance test of Inventive Examples G-01 to G-03 in Table 5, the glass compositions in Inventive Examples G-01 to G-03 had little water resistance, however, it is thought that, by reaction of the glass composition with aluminum (alloy) particles during firing of the conductive paste, the water resistance as a glass composition was improved, and the water resistance as the back surface electrode 5 was also improved. Further, it is thought that this reaction also improved the tight adhesiveness to obtain a satisfactory result, however, it is thought that the conversion efficiency was low without reaching 16% because this reaction restricts diffusion of aluminum from the back surface electrode (aluminum electrode wire) 5 into the semiconductor substrate 1.

In Inventive Example G-06, Inventive Example E-08, Inventive Example G-15, and Inventive Example G-16, the conversion efficiency did not reach 16%, a high conversion efficiency was not obtained, and a satisfactory result was not obtained, with evaluation 'C' by the tight adhesiveness test and the water resistance test. It is thought that this was caused by the following. That is, in Inventive Example G-06, Inventive Example G-08, Inventive Example G-15, and Inventive Example G-16, the starting temperature of crystallization, shown in Table 5, was high and the softening and flowing characteristics were unsatisfactory such that softening occurred at a high temperature. Accordingly, the glass composition could not cover the surface of aluminum (alloy) particles, and the glass composition could not make the aluminum (alloy) particles adhere to each other so that the aluminum (alloy) particles could not be sufficiently sintered with each other.

From the above, similarly to the evaluation of the glass composition alone, also as evaluation of the solar battery cell, it proved that satisfactory evaluation was obtained in Inventive Example G-04, Inventive Example G-05, Inventive Example G-07, and Inventive Examples G-09 to G-14. From this, it proved that the composition ratio of vanadium pentoxide ($V_2O_5$) should be 40 weight % to 70 weight %, as shown in Inventive Example G-04, Inventive Example G-05, Inventive Example G-07, and Inventive Examples G-09 to G-14 in Table 4. Further, it proved that the composition ratio of the total of the alkaline-earth oxides should be 20 weight % to 40 weight %. Still further, it proved that the composition ratio of the total of the alkali metal oxides should be 10 weight % to 20 weight %. Yet further, it proved from Table 5 that a glass composition that crystallizes at a temperature of 500° C. or lower and shows a satisfactory flowing characteristic at a temperature of 700° C. or lower is preferable, and particularly a glass composition, which crystallizes at a temperature of 400° C. or lower and shows a satisfactory flowing characteristic at a temperature of 600° C. or lower (Inventive Example G-04, Inventive Example G-05, Inventive Example G-07, and Inventive Examples G-09, Inventive Example G-10, and Inventive Example G-12), is effective.

Third Embodiment

Discussion on Content of Glass Composition in Conductive Paste

In a third embodiment, discussion was made on the content of a glass composition in each conductive paste.

As shown in Table 7, in the third embodiment, the content of a glass composition in a conductive paste was changed to prepare conductive pastes in totally 13 kinds, namely Inventive Examples H-01 to H-13, and aluminum electrode wires were prepared using, the respective conductive pastes. Using the prepared aluminum electrode wires, a tight adhesiveness test, a water resistance test of an aluminum electrode wire, and measurement of specific resistance were performed.

TABLE 7

| Inventive Example | Glass Content (Weight Part) | Tight Adhesiveness Test Result Si Substrate | Tight Adhesiveness Test Result $Al_2O_3$ Substrate | Water Resistance Test Result 50° C.- 8 hours | Specific Resistance ($\Omega$cm) |
|---|---|---|---|---|---|
| H-01 | 0.0 | C | C | C | $10^{-2}$ to $10^{-1}$ |
| H-02 | 0.1 | A | C | C | $10^{-2}$ to $10^{-1}$ |
| H-03 | 0.2 | A | A | A | $10^{-4}$ to $10^{-3}$ |
| H-04 | 0.3 | A | A | A | $10^{-4}$ to $10^{-3}$ |
| H-05 | 0.5 | A | A | A | $10^{-5}$ to $10^{-4}$ |
| H-06 | 1.0 | A | A | A | $10^{-5}$ to $10^{-4}$ |
| H-07 | 1.5 | A | A | A | $10^{-5}$ to $10^{-4}$ |
| H-08 | 2.0 | A | A | A | $10^{-5}$ to $10^{-4}$ |
| H-09 | 5.0 | A (Large Substrate Distortion) | A | A | $10^{-5}$ to $10^{-4}$ |
| H-10 | 10.0 | A (Large Substrate Distortion) | A | A | $10^{-4}$ to $10^{-3}$ |
| H-11 | 15.0 | A (Large Substrate Distortion) | A | A | $10^{-4}$ to $10^{-3}$ |
| H-12 | 20.0 | A (Large Substrate Distortion) | A | A | $10^{-4}$ to $10^{-3}$ |
| H-13 | 30.0 | A (Substrate Broken) | A | A | $10^{-2}$ to $10^{-1}$ |

(3-1 Preparation of Glass Composition)

As the glass composition for the conductive pastes in Inventive Examples H-01 to H-13, a glass composition same as the glass composition in Inventive Example G-11 in Table 4 was produced by the same manufacturing method as that in the second embodiment. The average particle diameter (D50) of the glass composition powdered by crushing was approximately 1 μm.

(3-2 Preparation of Conductive Paste)

As metal particles to be contained in the conductive pastes, aluminum particles having an average particle diameter (D50) of approximately 3 μm were used. For the conductive pastes, powder of the glass composition (oxide) was mixed to the 100 weight parts of aluminum particle, changing the respective weight parts from 0 weight part to 30 weight parts for Inventive Examples H-01 to H-13. Further, ethyl cellulose, which is a binder resin, and α-terpineol, which is a solvent, were made contained such that the content of the solid portion formed from the aluminum particles and the powder of the glass composition (oxide) becomes more or less 75 weight %. Other preparation conditions in preparing the conductive pastes were set the same as in the first embodiment.

The (glass) content in the glass composition with respect to 100 weight parts of aluminum particles was 0 (zero) weight part in the conductive paste in Inventive Example H-01.

Similarly, the (glass) content in the glass composition was 0.1 weight part in inventive Example H-02.

Similarly, the (glass) content in the glass composition was 0.2 weight parts in inventive Example H-03.

Similarly, the (glass) content in the glass composition was 0.3 weight parts in inventive Example H-04.

Similarly, the (glass) content in the glass composition was 0.5 weight parts in inventive Example H-05.

Similarly, the (glass) content in the glass composition was 1.0 weight part in inventive Example H-06.

Similarly, the (glass) content in the glass composition was 1.5 weight parts in inventive Example H-07.

Similarly, the (glass) content in the glass composition was 2.0 weight parts in inventive Example H-08.

Similarly, the (glass) content in the glass composition was 5.0 weight parts in inventive Example H-09.

Similarly, the (glass) content in the glass composition was 10.0 weight parts in inventive Example H-10.

Similarly, the (glass) content in the glass composition was 15.0 weight parts in inventive Example H-11.

Similarly, the (glass) content in the glass composition was 20.0 weight parts in inventive Example H-12.

Similarly, the (glass) content in the glass composition was 30.0 weight parts in inventive Example H-13.

(3-3 Preparation of Aluminum Electrode Wire)

Aluminum electrode wires were prepared with the respective conductive pastes respectively prepared in Inventive Example H-01 to H-13. In the third embodiment, as substrates for the aluminum electrode wires, polycrystalline silicon (Si) substrates (200 μm thick) and alumina ($Al_2O_3$) substrates (1.0 mm thick) were used, the substrates being 25 mm square. A conductive paste was coated on a silicon (Si) substrate and on an alumina ($Al_2O_3$) substrate by screen printing, and then dried. After the drying, the conductive paste was rapidly heated up to 800° C. in the atmosphere by an infrared rapidly heating furnace, fired with maintenance for 10 seconds, and thus an aluminum electrode wire was formed.

(3-4 Evaluation of Aluminum Electrode Wire)

As shown in Table 7, as evaluation of each aluminum electrode wire, a tight adhesiveness test of the aluminum electrode wire to a silicon (Si) substrate or an alumina ($Al_2O_3$) substrate, a water resistance test of the aluminum electrode wire, and a specific resistance measurement of the aluminum electrode wire were performed. The tight adhesiveness test and the water resistance test were evaluated similarly to the second embodiment. In the specific resistance measurement, the electrical resistance of the aluminum electrode wire was measured by a four-terminal method at a room temperature, and the specific resistance was computed, using a measured film thickness of the aluminum electrode wire.

As shown in Table 7, as a result of the tight adhesiveness test, in case that the substrate was a silicon (Si) substrate, Inventive Examples H-02 to H-13 were evaluated 'A', and Inventive Example H-01 was evaluated 'C'. That is, satisfactory tight adhesiveness was obtained with a glass content larger than or equal to 0.1 weight part. Incidentally, in Inventive Example H-09 to H-13, distortion of the substrate was large, and particularly in Inventive Example H-13, distortion was exceedingly large to cause a case of breaking the substrate.

As a result of the tight adhesiveness test, in case that the substrate was an alumina ($Al_2O_3$) substrate, Inventive Examples H-03 to H-13 were evaluated 'A', and Inventive Example H-01 and Inventive Example H-02 were evaluated 'C'. That is, a satisfactory tight adhesiveness was obtained with a glass content larger than or equal to 0.2 weight parts. Incidentally, it is thought distortion of a substrate was not caused in the case of an alumina ($Al_2O_3$) because not only the thickness of the substrate was five times as large as the thickness of a silicon (Si) substrate but also the thermal expansion coefficient agreed well between an aluminum electrode wire and an alumina ($Al_2O_3$) substrate.

As shown in Table 7, as a result of the water resistance test of aluminum electrode wires, Inventive Examples H-03 to H-13 were evaluated 'A', and Inventive Example H-01 and H-02 were evaluated 'C'. That is, satisfactory water resistance was obtained with a glass content larger than or equal to 0.2 weight parts.

As shown in Table 7, as a result of the specific resistance measurement of aluminum electrode wires, the specific resistances (Ω cm) in Inventive Examples H-05 to H-09 were low resistances in a range from $10^{-5}$ to $10^{-4}$, and the specific resistances in Inventive Example H-03, Inventive Example H-04, and Inventive Examples H-10 to H-12 were low resistances in a range from $10^{-4}$ to $10^{-3}$, while the specific resistances in Inventive Example H-01, Inventive Example H-02, and Inventive Example H-13 were high resistances in a range from $10^{-2}$ to $10^{-1}$. That is, a low specific resistance (in a range from $10^{-4}$ to $10^{-3}$) was obtained with a glass content that is larger than or equal to 0.2 weight parts and is smaller than or equal to 20.0 weight parts (Inventive Examples H-03 to H-12). Further, an even lower specific resistance (in a range from $10^{-5}$ to $10^{-4}$) was obtained with a glass content that is larger than or equal to 0.5 weight parts and is lower than or equal to 5.0 weight parts (Inventive Example H-05 to H-09).

From the above, regarding alumina ($Al_2O_3$) substrates, it proved that, taking into account results of the tight adhesiveness test, the water resistance test, and the specific resistance measurement, the glass content is preferable in Inventive Example H-03 to H-12, and concretely, the glass content is preferably in a range from 2 weight parts to 20.0 weight parts. Further preferably, from the viewpoint that the specific resistance becomes in a range from $10^{-5}$ to $10^{-4}$, it proved that the glass content is preferably in a range from 0.5 weight parts to 5.0 weight parts in Inventive Examples H-05 to H-09.

From the above, regarding silicon (Si) substrates, it proved that, taking into account results of the tight adhesiveness test, the water resistance test, and the specific resistance measurement, the glass content is preferable in Inventive Example H-03 to H-08, and concretely, the glass content is preferably in a range from 0.2 weight parts to 2.0 weight parts. Further preferably, from the viewpoint that the specific resistance becomes in a range from $10^{-5}$ to $10^{-4}$, the glass content is preferably in a range from 0.5 weight parts to 2.0 weight parts in Inventive Examples H-05 to H-08.

Fourth Embodiment

Discussion on Applying Aluminum Electrode Wire to Address Electrode of Plasma Display Panel In a fourth embodiment, discussion was made on applying an aluminum electrode wire to the address electrode of a plasma display panel.

Figure 2:
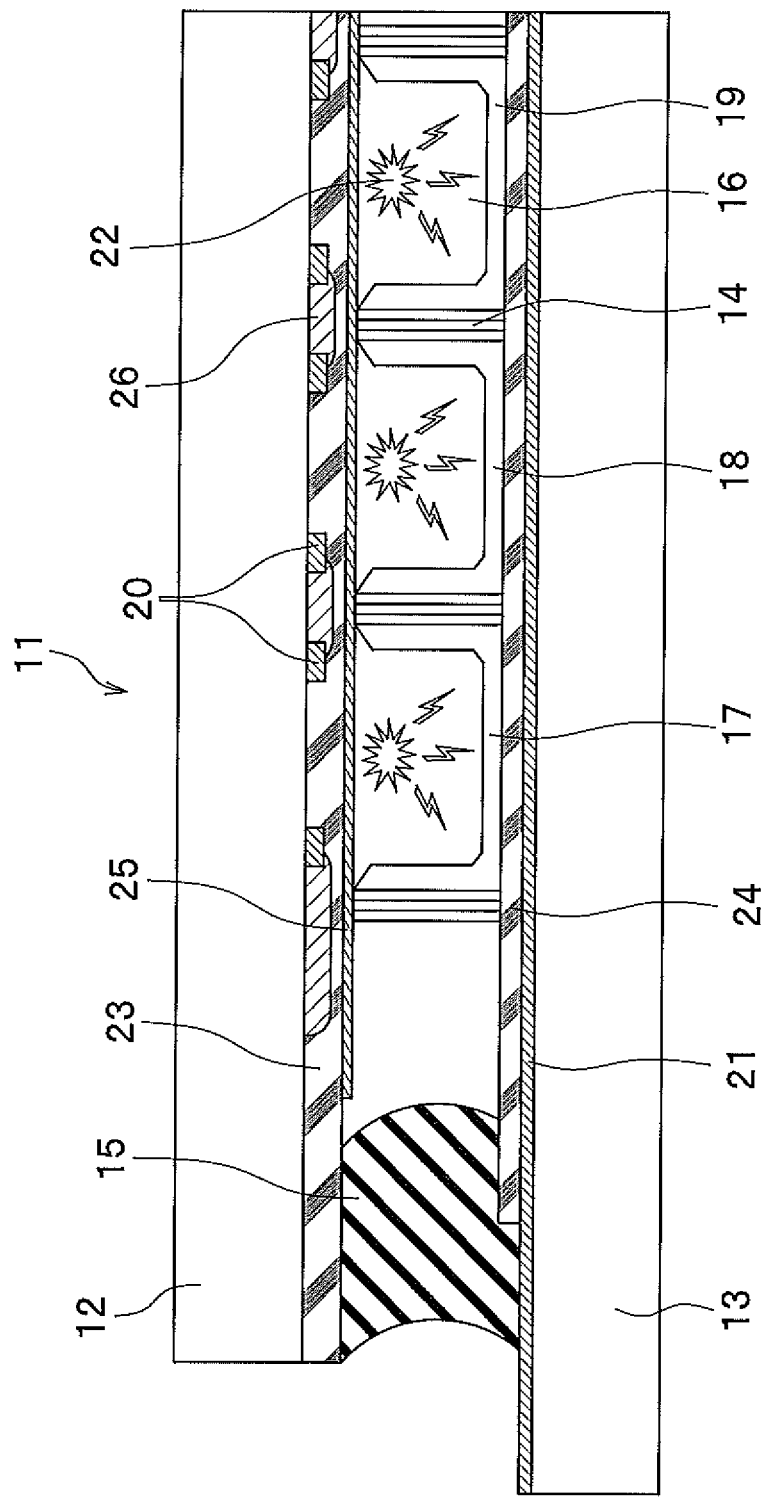
FIG. 2 is a part of a cross-sectional view of a plasma display panel (electronic component) according to a fourth embodiment of the invention.

FIG. 2 is a part of a cross-sectional view of a plasma display panel (PDP: electronic component) 11 according to the fourth embodiment of the invention. In the fourth embodiment, as an electronic component to which the present invention is applicable, description will be made below, taking an example of a plasma display panel. An aluminum electrode wire, for an electronic component, according to the present invention is applied to the address electrode 21 of the plasma display panel 11. The plasma display panel 11 is arranged such that a front plate 12 and a back plate 13 face each other with a gap of 100 to 150 μm, and the gap between the front plate 12 and the back plate 13 is maintained by isolation walls 14. The marginal portions of the front plate 12 and the back plate 13 are tightly sealed by an adhesive sealing material 15, and rare gas is filled inside the panel at the gap between the front plate 12 and the back plate 13.

Display electrodes 20 are formed on the front plate 12. Further, a black matrix (black band) 26 is formed between the display electrodes 20 of neighboring cells 16 in some cases. A dielectric layer 23 is formed on the display electrodes 20 and the black matrices 26, and a protection layer 25 (for example, a vapor deposited film of magnesium oxide (MgO)) for protecting the display electrodes 20 and the like from discharge is formed on the dielectric layer 23.

An address electrode (corresponding to the aluminum electrode wire) 21 is formed on the back plate (corresponding to the substrate) 13. In plan view, the address electrode 21 is formed such as to be perpendicular to the display electrode 20. A dielectric layer 24 is formed on the address electrode 21, and isolation walls 14 are provided to form cells 16 on the dielectric layer 24. The isolation walls 14 have a structure in a stripe form or a grid (or box) form.

In the gap between the front plate 12 and the back plate 13, minute spaces partitioned by isolation walls 14 become cells 16. A fluorescence body 17, 18, or 19 is filled in a cell 16. Three cells corresponding to three primary colors, namely a cell 16 in which red fluorescence body 17 is filled, a cell 16 in which green fluorescence body 18 is filled, and a cell 16 in which blue fluorescence body 19 is filled form one pixel. The respective pixels can emit lights in various colors, according to signals applied to display electrodes 20 and the address electrode 21.

A method for manufacturing a plasma display panel 11 will be described below.

(4-1 Preparation of Conductive Paste)

First, aluminum and a small amount of silicon were fused, and aluminum (alloy) particles containing a small amount of silicon in a spherical form were formed by the water atomizing method. The average particle diameter (D50) of these aluminum (alloy) particles for conductive paste was set approximately to 1 μm.

As a glass composition for a conductive paste, a glass composition that is the same as the glass composition in Inventive Example G-11 in Table 4 was prepared by a preparation method that is the same as the preparation method in the second embodiment. The average particle diameter (D50) of a glass composition powdered by crushing was smaller than or equal to 1 μm.

The powder of the glass composition (oxide) in 10 weight parts was mixed to 100 weight parts of the prepared aluminum (alloy) particles. Further, to this mixture, a binder resin, a solvent, and a photosensitizing agent were added and mixed, then the mixture was kneaded. The binder resin dissolved in the solvent, then the aluminum (alloy) particles and the powder of the glass composition (oxide) dispersed in the binder resin having dissolved in the solvent, and a conductive paste was thus completed. Herein, ethyl cellulose was used as the binder resin, and butyl carbitol acetate was uses as the solvent.

(4-2 Preparation of Plasma Display Panel)

Then, the plasma display was produced. First, the conductive paste was coated on the whole surface of the back plate 13 by the screen print method, and was dried in the atmosphere at 150° C. The coated surface was masked and irradiated with ultraviolet light, and the address electrode 21 was thus formed on the back plate 13 wherein unnecessary portions were removed. Then, a commercially available silver paste was coated on the whole surface of the front plate 12 by the screen print method, and was dried in the atmosphere at 150° C. Unnecessary portions of the coated film of the silver paste were removed by a photolithography method and an etching method, and patterning of the display electrodes 20 was performed.

Thereafter, firing was performed in the atmosphere for 30 minutes at a firing temperature of 600° C., and the display electrodes 20 and the address electrode 21 were completed. In this firing, although the firing atmosphere became acid atmosphere, a change in the color of the aluminum metal particles, caused by chemical reaction, or the like did not particularly occur on the address electrode 21 through this firing.

Then, a black paste to become the black matrices 26 and a dielectric paste to become the dielectric layers 23 and 24 were coated on each of the front plate 12 and the back plate 13, and were fired for 30 minutes in the atmosphere at a firing temperature of 610° C. In this firing, although the firing atmosphere became acid atmosphere and the dielectric layer 24 directly contacted the address electrode 21, reaction between the dielectric layer 24 and the address electrode 21 was not caused by this firing. The protection layer 25 was vapor-deposited from the dielectric layer 23 side of the front plate 12.

The isolation walls 14 were provided on the dielectric layer 24 on the back plate 13 side. An isolation wall 14 formed from a glass structure is formed from a structural material containing at least a glass composition and a filler, and is formed from a sintered or fired product obtained by sintering the structural material. A volatile sheet with recessions formed at isolation wall portions is stuck on the dielectric layer 24, and paste for the isolation walls 14 is poured into the recessions and fired in a range 500 to 600° C. Thus, the volatile sheet is volatilized and the isolation walls 14 can be formed. Further, the isolation walls 14 can also be formed in the following manner. That is, a paste for the isolation walls 14 is coated on the whole surface of the dielectric layer 24 by a printing method, is masked after drying, and is fired in a range 500 to 600° C. after removing unnecessary portions by sand blasting, chemical etching, or the like. These isolation walls 14 were disposed on the dielectric layer 24 to form the cells 16. Then, pastes for the fluorescence bodies corresponding to the three primary colors were filled into the corresponding cells 16 and were fired in a range 450 to 500° C. Thus, the red fluorescence bodies 17, the green fluorescence bodies 18, the blue fluorescence bodies 19 were formed.

Then, the adhesive sealing material 15 was coated on the marginal portion of either the front plate 12 or the back plate 13 by a dispenser method or a printing method. Then, the front plate 12 and the back plate 13 were subjected to sealing-adhesion. For the sealing-adhesion of the front plate 12 and the back plate 13, the front plate 12 and the back plate 13 were disposed facing each other by accurate position alignment, and were heated to a range from 420 to 500° C. In this heating, the gas in the cells 16 was removed and a noble gas was filled instead. The adhesive sealing material may be preliminarily fired simultaneously with the firing of the pastes for fluorescence bodies in forming the fluorescence bodies 17 to 19. By preliminarily firing the adhesive sealing material 15, gas bubbles included in the adhesive sealing material 15 can be reduced. In FIG. 2, the adhesive sealing material 15 and the address electrode 21 directly contact with each other. The adhesive sealing material 15 was heated in the preliminary firing and in glass seal-adhering, and the firing atmosphere became acid atmosphere, however, chemical reaction between the adhesive sealing material 15 and the address electrode 21 did not occur. In such a manner the plasma display panel 11 was completed.

(4-3 Evaluation of Plasma Display Panel)

(Appearance Test)

An appearance test of the periphery of the address electrode 21 was performed. Generation of a gap or change in color was not recognized at the surface boundary portion between the address electrode 21 and the back plate 13 or the surface boundary portion between the address electrode 21 and the dielectric layer 24. Thus, the plasma display panel 11 was produced in a satisfactory appearance state.

(Lighting Test)

Subsequently, a lighting test of the produced plasma display panel 11 was performed. In order to make cells 16 of the plasma display panel 11 light (emit light), a voltage was applied between the display electrodes 20 of the cells 16 desired to light and the address electrode 21 to perform address discharge, and noble gas was thereby excited into a plasma state so that wall charges were accumulated inside the cells 16. Then, by applying a certain voltage between a pair of display electrodes 20, display discharge occurred only in the cells 16 in which the wall charges have been accumulated, and the cells 16 were thus made to emit ultraviolet rays 22. Using these ultraviolet rays 22, the fluorescence bodies 17 to 19 were made to emit light to display an image (information).

Before and after the display of this image information, the specific resistance of the address electrode 21 did not increase. Further, without a drop in the voltage resistance between adjacent address electrodes 21, voltage could be increased to light cells 16. Further, migration phenomenon of an electrode wire of a silver thick film or the like, which particularly cause a problem, was not recognized. For the address electrode 21 of the plasma display panel 11 in the fourth embodiment, expensive silver was not used, which can significantly contribute to reducing the cost.

In the fourth embodiment, an aluminum electrode wire was applied to the address electrode 21, however, without being limited thereto, an aluminum electrode wire may be applied to the display electrode 20. In this case, it is desirable to add silver particles besides aluminum particles in the conductive paste.

In the above embodiments according to the present invention, as examples of applying an aluminum electrode wire, application of an aluminum electrode wire according to the invention to the back surface electrode 5 formed on the back surface of the solar battery cell 10 and application to the address electrode 21 of the plasma display panel 11 have been described, however, without necessarily being limited to these two electronic components, it is possible to widely apply aluminum electrode wires according to the invention to the electrodes of other electronic components. Particularly, the invention is extremely effective for electronic components that require high performance and high reliability of an aluminum electrode wire and electronic components for which change from an expensive silver electrode wire to an inexpensive aluminum electrode wire is desired.

REFERENCE SYMBOLS

1 . . . semiconductor substrate (substrate)
2 . . . diffusion layer
3 . . . reflection preventing layer
4 . . . photosensitive surface electrode wire
5 . . . back surface electrode (aluminum electrode wire)
6 . . . output electrode
7 . . . alloy layer
10 . . . solar battery cell (electronic component)
11 . . . plasma display panel (electronic component)
12 . . . front plate (substrate)
13 . . . back plate (substrate)
15 . . . adhesive sealing material
16 . . . cell
20 . . . display electrode (aluminum electrode wire)
21 . . . address electrode (aluminum electrode wire)
22 . . . ultraviolet ray
23, 24 . . . dielectric layer

The invention claimed is:

1. A glass composition for an aluminum electrode wire consisting essentially of an oxide of vanadium (V), an oxide/oxides of an alkaline-earth metal/alkaline-earth metals, and an oxide/oxides of an alkali metal/alkali metals, wherein the oxide of vanadium (V) is vanadium pentoxide ($V_2O_5$), and the oxide/oxides of the alkaline-earth metal/alkaline-earth metals, represented by a chemical formula RnO, are at 20 to 40 weight %.

2. The glass composition for an aluminum electrode wire according to claim 1, wherein, as an element/elements of the alkaline-earth metal/alkaline-earth metals, barium (Ba) and at least one or more elements of calcium (Ca) and strontium (Sr) are contained, and as an element/elements of the alkali metal/alkali metals, one or more elements of sodium (Na), potassium (K), rubidium (Rb), and cesium (Cs) are contained.

3. The glass composition for an aluminum electrode wire according to claim 2, wherein the vanadium pentoxide is contained by 40 to 70 weight %, and the oxide/oxides of an alkali metal/alkali metals, represented by a chemical formula R2O, are at 10 to 20 weight %.

4. The glass composition for an aluminum electrode wire according to claim 1, wherein fine crystals are separated out inside the glass composition when the aluminum electrode wire is fired.

5. The glass composition for an aluminum electrode wire according to claim 1, wherein the glass composition crystalizes at a temperature lower than or equal to 500° C., and softens and flows at a temperature lower than or equal to 700° C.

6. The glass composition for an aluminum electrode wire according to claim 1, wherein the glass composition crystalizes at a temperature lower than or equal to 400° C., and softens and flows at a temperature lower than or equal to 600° C.

7. A conductive paste for an aluminum electrode wire, a plurality of particles formed from aluminum and/or an alloy containing aluminum and powder formed from a glass composition being dispersed in a binder resin dissolved in a solvent, wherein the glass composition for an aluminum electrode wire according to claim 1 is used as the glass composition forming the powder.

8. The conductive paste for an aluminum electrode wire according to claim 7, wherein the powder is contained by 0.2 to 20 weight parts with respect to 100 weight parts of the particles.

9. An electronic component provided with an aluminum electrode wire containing a plurality of particles formed from aluminum and/or an alloy containing aluminum and a glass composition for fixing the particles to a substrate, wherein the glass composition for an aluminum electrode wire according to claim 1 is used as the glass composition for fixing the particles to the substrate.

10. The electronic component according to claim 9, wherein fine crystals are separated out in the glass composition.

11. The electronic component according to claim 9, wherein the glass composition is contained by 0.2 to 20 weight parts with respect to 100 weight parts of the particles.

12. The electronic component according to claim 9, wherein the substrate includes a p-type semiconductor, and wherein the aluminum electrode wire is formed on the p-type semiconductor.

13. The electronic component according to claim 12, wherein the substrate is a solar battery cell having a p-n junction.

14. The electronic component according to claim 9, wherein the electronic component is a display panel.

15. A method for manufacturing an electronic component for which an aluminum electrode wire is formed by:
coating, on a substrate, a conductive paste in which a plurality of particles formed from aluminum and/or an alloy containing aluminum and powder formed from a glass composition consisting essentially of vanadium pentoxide ($V_2O$), an oxide/oxides of an alkaline-earth metal/alkaline-earth metals, represented by a chemical formula RnO and at 20 to 40 weight %, and an oxide/oxides of an alkali metal/alkali metals, are dispersed in a binder resin dissolved in a solvent; and
firing the coated conductive paste.

\* \* \* \* \*